United States Patent
Bang et al.

(10) Patent No.: US 10,224,218 B2
(45) Date of Patent: Mar. 5, 2019

(54) METHOD FOR FABRICATING SEMICONDUCTOR PACKAGE HAVING A MULTI-LAYER ENCAPSULATED CONDUCTIVE SUBSTRATE AND STRUCTURE

(71) Applicant: Amkor Technology Inc., Tempe, AZ (US)

(72) Inventors: Won Bae Bang, Gyeonggi-do (KR); Byong Jin Kim, Gyeonggi-do (KR); Gi Jeong Kim, Gyeonggi-do (KR); Ji Young Chung, Gyeonggi-do (KR)

(73) Assignee: Amkor Technology Inc., Tempe, AZ (US)

( * ) Notice: Subject to any disclaimer, the term of this patent is extended or adjusted under 35 U.S.C. 154(b) by 0 days.

(21) Appl. No.: 15/173,281

(22) Filed: Jun. 3, 2016

(65) Prior Publication Data

US 2017/0005029 A1    Jan. 5, 2017

(30) Foreign Application Priority Data

Jul. 1, 2015    (KR) .................. 10-2015-0094305

(51) Int. Cl.
*H01L 21/56*    (2006.01)
*H01L 21/31*    (2006.01)
(Continued)

(52) U.S. Cl.
CPC ........ *H01L 21/565* (2013.01); *H01L 21/4846* (2013.01); *H01L 23/3114* (2013.01);
(Continued)

(58) Field of Classification Search
CPC .............. H01L 21/4846; H01L 21/486; H01L 21/4857; H01L 23/49861; H01L 23/49827
See application file for complete search history.

(56) References Cited

U.S. PATENT DOCUMENTS 7,144,759 B1 *  12/2006  Hilton ................. H01L 21/4857
                                              257/E21.503
7,435,680 B2 *  10/2008  Nakamura .......... H01L 21/4857
                                              257/E21.512
(Continued)

FOREIGN PATENT DOCUMENTS

JP        2008545274 A    12/2008
KR    10-2003-0058917 A    7/2003
KR    10-2013-0016565 A    2/2013

*Primary Examiner* — David A Zarneke
(74) *Attorney, Agent, or Firm* — Kevin B. Jackson

(57) ABSTRACT

In one embodiment, a semiconductor package includes a multi-layer encapsulated conductive substrate having a fine pitch. The multi-layer encapsulated conductive substrate includes a conductive leads spaced apart from each other, a first encapsulant disposed between the leads, a first conductive layer electrically connected to the plurality of leads, conductive pillars disposed on the first conductive layer, a second encapsulant encapsulating the first conductive layer and the conductive pillars, and a second conductive layer electrically connected to the conductive pillars and exposed in the second encapsulant. A semiconductor die is electrically connected to the second patterned conductive layer. A third encapsulant covers at least the semiconductor die.

20 Claims, 23 Drawing Sheets

(51) Int. Cl.
   *H01L 23/498* (2006.01)
   *H01L 23/31* (2006.01)
   *H01L 21/48* (2006.01)

(52) U.S. Cl.
   CPC .. *H01L 23/49827* (2013.01); *H01L 23/49861* (2013.01); *H01L 23/49816* (2013.01); *H01L 2224/16* (2013.01); *H01L 2924/181* (2013.01)

(56) References Cited

U.S. PATENT DOCUMENTS

| | | | | |
|---|---|---|---|---|
| 7,696,613 B2* | 4/2010 | Nakamura | ........ | H01L 23/49822 257/668 |
| 8,357,860 B2* | 1/2013 | Kaneko | ............ | H01L 23/49811 174/260 |
| 8,513,818 B2* | 8/2013 | Hagihara | ................ | H01L 24/03 257/778 |
| 8,859,912 B2* | 10/2014 | Tseng | ..................... | H05K 1/111 174/262 |
| 9,048,231 B2* | 6/2015 | Hou | ................... | H01L 23/49811 |
| 9,627,308 B2* | 4/2017 | Kobayashi | ........ | H01L 23/49827 |
| 2003/0116840 A1* | 6/2003 | Hacke | ................. | H01L 21/4857 257/678 |
| 2003/0116843 A1 | 6/2003 | Iijima et al. | | |
| 2007/0001278 A1 | 1/2007 | Jeon et al. | | |
| 2007/0249154 A1* | 10/2007 | Chen | ................... | H01L 21/4857 438/618 |
| 2008/0060838 A1* | 3/2008 | Chen | ................... | H01L 21/4857 174/262 |
| 2008/0197501 A1* | 8/2008 | Imanaka | ........... | H01L 21/4857 257/758 |
| 2008/0296752 A1* | 12/2008 | Nakajima | ........... | H01L 21/4853 257/697 |
| 2010/0096744 A1* | 4/2010 | Mori | ................... | H01L 21/4853 257/698 |
| 2010/0314037 A1* | 12/2010 | Liu | ..................... | H01L 21/6835 156/248 |
| 2011/0147929 A1* | 6/2011 | Roy | ................... | H01L 21/4857 257/738 |
| 2011/0221071 A1* | 9/2011 | Motohashi | .......... | H01L 21/4857 257/774 |
| 2012/0067635 A1* | 3/2012 | Nang | ................... | B23K 1/0016 174/260 |
| 2012/0161311 A1* | 6/2012 | Miyasaka | ......... | H01L 23/49822 257/734 |
| 2012/0312590 A1* | 12/2012 | Maeda | ................. | H05K 1/0269 174/261 |
| 2013/0008705 A1* | 1/2013 | Tseng | ..................... | H05K 1/111 174/266 |
| 2013/0008706 A1* | 1/2013 | Tseng | ................ | H01L 23/49822 174/266 |
| 2013/0009293 A1* | 1/2013 | Tseng | ................ | H01L 23/49827 257/666 |
| 2013/0009320 A1* | 1/2013 | Yoo | ..................... | H01L 21/4853 257/774 |
| 2013/0230947 A1 | 9/2013 | Hsu et al. | | |
| 2014/0093999 A1* | 4/2014 | Teh | ....................... | H01L 21/568 438/107 |
| 2014/0268612 A1* | 9/2014 | Zhang | ................... | H01L 23/492 361/767 |
| 2015/0041969 A1* | 2/2015 | Chang | ................ | H01L 25/0655 257/734 |
| 2015/0194378 A1* | 7/2015 | Tsang | ................ | H01L 23/49838 174/257 |
| 2015/0194405 A1* | 7/2015 | Liang | ................ | H01L 23/49811 257/737 |
| 2015/0342039 A1* | 11/2015 | Wu | ..................... | H01L 21/4857 174/251 |
| 2015/0366064 A1* | 12/2015 | Hsu | ................... | H01L 23/49822 361/760 |
| 2016/0035661 A1* | 2/2016 | Suzuki | ............. | H01L 23/49822 174/251 |
| 2016/0088736 A1* | 3/2016 | Sankman | ............... | H05K 1/162 361/748 |
| 2016/0155715 A1* | 6/2016 | Lin | ......................... | H01L 24/17 257/737 |
| 2016/0254233 A1* | 9/2016 | Hu | ....................... | H01L 23/562 428/213 |
| 2016/0358847 A1* | 12/2016 | Shih | ................... | H01L 21/6835 |

* cited by examiner

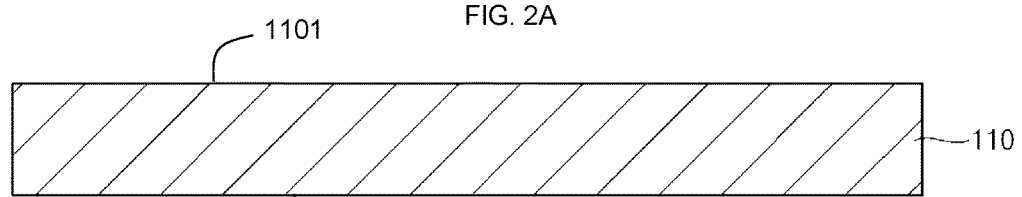
FIG. 2A
FIG. 2B
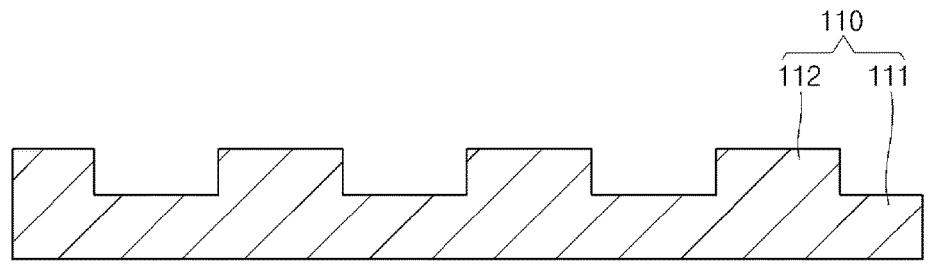
FIG. 2C
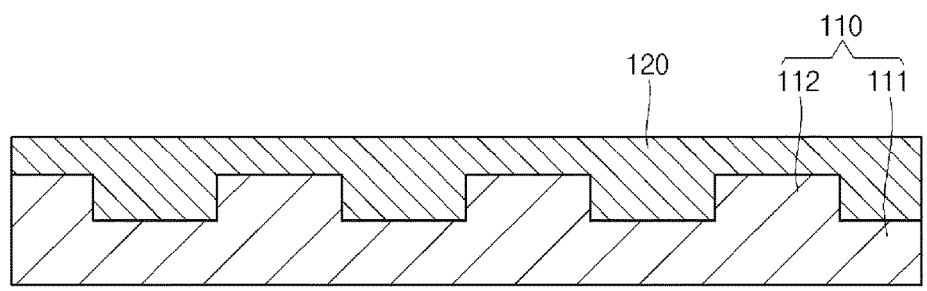

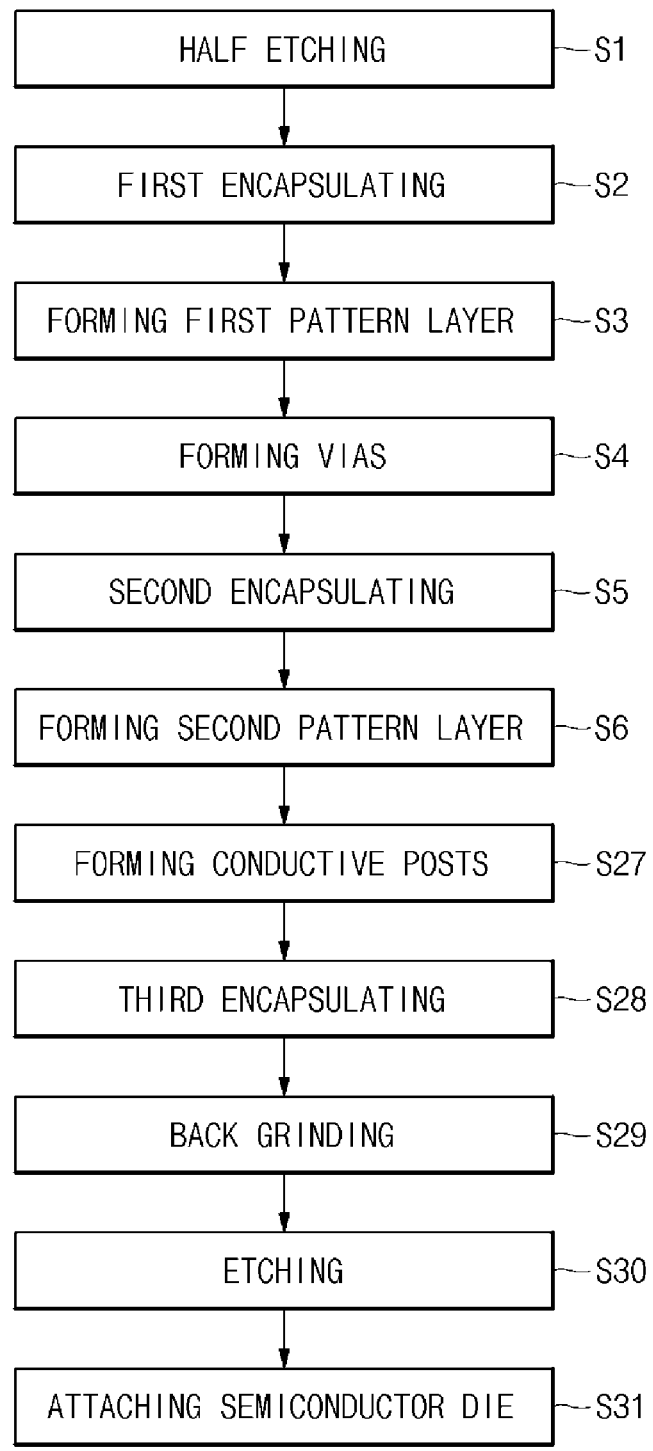

METHOD FOR FABRICATING SEMICONDUCTOR PACKAGE HAVING A MULTI-LAYER ENCAPSULATED CONDUCTIVE SUBSTRATE AND STRUCTURE

CROSS-REFERENCE TO RELATED APPLICATIONS

This application claims priority to and the benefit of Korean Patent Application No. 10-2015-0094305 filed on Jul. 1, 2015 in the Korean Intellectual Property Office, and all the benefits accruing therefrom under 35 U.S.C. § 119, the contents of which in its entirety are herein incorporated by reference.

BACKGROUND

The present invention relates, in general, to electronics, and more particularly, to semiconductor packages, structures thereof, and methods of fabricating semiconductor packages.

In general, a lead frame used for a semiconductor device package is fabricated by performing a mechanical stamping or chemical etching process with respect to a metal strip. More particularly, the lead frame simultaneously serves as an interconnect structure for connecting a semiconductor die to an external circuit and as a frame for fixing a semiconductor package to an external device.

The lead frame may have various shapes according to the high density and high integration of semiconductor dies and the component mounting method. In order to electrically connect a semiconductor die to a lead frame, the semiconductor package is configured to connect bond pads of the semiconductor die to the lead frame using conductive bumps or conductive wires. The lead frame is separated into a frame (or a die pad) and a lead, and the semiconductor die is connected to the lead to exchange electrical signals. With a continuing demand for miniaturization and high performance of electronic devices, fine-pitch multi-layer interconnect structured frames are needed.

Accordingly, it is desirable to have a structure and a method of forming a packaged semiconductor device including a fine pitch multi-layer encapsulated interconnect main frame structure, such as a micro lead frame structure, that supports the demand for miniaturization and high performance electronic devices. It is also desirable to manufacture the fine pitch multi-layer encapsulated interconnect main structure in advance of completing the packaged semiconductor device to reduce manufacturing cycle time. Additionally, it is desirable for the structure and method to be easily incorporated into manufacturing flows, and to be cost effective.

BRIEF DESCRIPTION OF THE DRAWINGS

The above and other features of the present description will become more apparent by describing in detail exemplary embodiments thereof with reference to the attached drawings in which:

FIGS. 2A to 2M are cross-sectional views illustrating a manufacturing method of a semiconductor package according to the embodiment of FIG. 1;

FIG. 6 is a flowchart illustrating a manufacturing method of a semiconductor package according to a further embodiment of the present invention.

Figure 1:
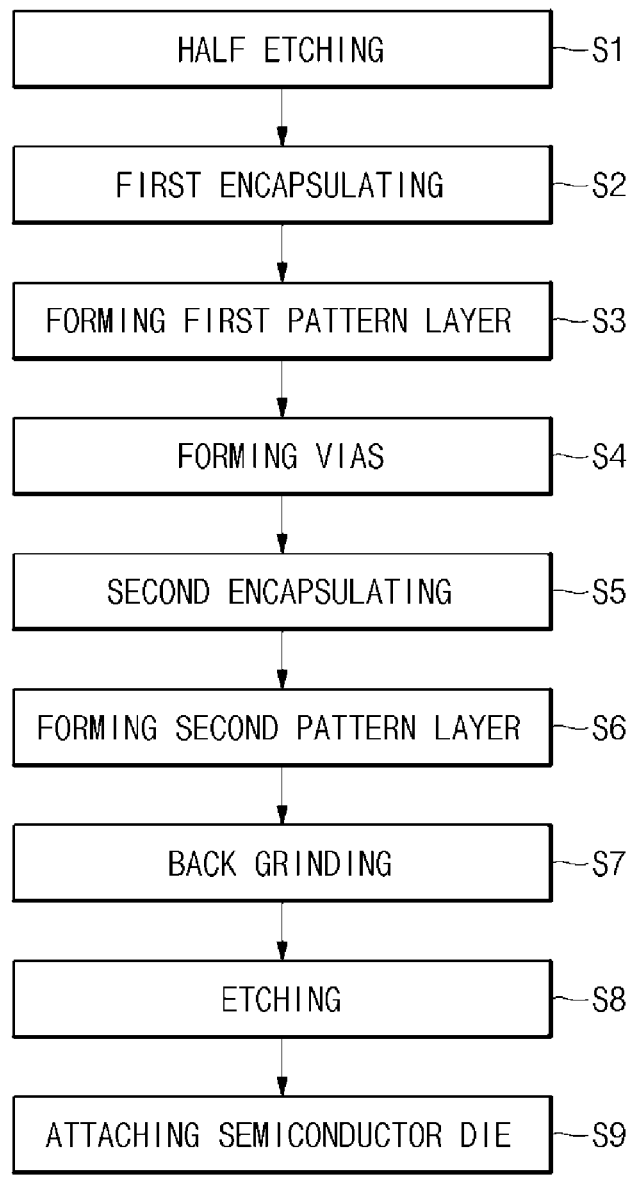
FIG. 1 is a flowchart illustrating a manufacturing method of a semiconductor package according to an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a multi-layer encapsulated conductive substrate, fine pitch multi-layer encapsulated conductive substrate, multi-layer encapsulated lead frame structure, or multi-layer molded conductive structure including at least two layers of encapsulated or molded conductive interconnect structures. In some embodiments, a carrier is attached to a surface of the multi-layer encapsulated conductive structure as a temporary support structure during manufacturing. An electronic component, such as a semiconductor die can be attached to the multi-layer encapsulated conductive substrate and further encapsulated with an additional encapsulant.

More particularly, in one embodiment a semiconductor package comprises a multi-layer encapsulated conductive substrate that includes a plurality of leads spaced apart from each other, a first encapsulant disposed between the plurality of leads, a first conductive layer electrically connected to the plurality of leads, conductive pillars disposed on the first conductive layer, a second encapsulant encapsulating the first conductive layer and the conductive pillars, and a second conductive layer electrically connected to the conductive pillars and disposed adjacent the second encapsulant. A semiconductor die is electrically coupled to the second conductive layer. A third encapsulant encapsulates at least the semiconductor die.

In another embodiment, a manufacturing method of a semiconductor package comprises providing a multi-layer encapsulated conductive substrate, which includes conductive leads spaced apart from each other, a first encapsulant disposed between the conductive leads, a first conductive layer electrically connected to the conductive leads, conductive pillars disposed on the first conductive layer, a second encapsulant encapsulating the first conductive layer and the conductive pillars, wherein the conductive pillars are exposed to the outside of the second encapsulant, and a second conductive layer electrically connected to the conductive pillars and disposed adjacent the second encapsulant. The method includes electrically coupling a semiconductor die to the second conductive layer. The method includes forming a third encapsulant covering at the least the semiconductor die.

In a further embodiment, a method of making a semiconductor package comprises preparing a main frame and partially removing an upper portion of the main frame to form a frame and leads protruding from the frame. The method includes first encapsulating the leads by a first encapsulant and exposing first surfaces of the leads to the outside. The method includes forming a first conductive layer electrically connected to the leads. The method includes forming conductive vias electrically connected to the first conductive layer. The method includes second encapsulating the conductive vias and the first conductive layer using a second encapsulant and removing an upper portion of the second encapsulant to expose the conductive vias to the outside. The method includes forming a second conductive layer electrically connected to the conductive vias. The method includes exposing second surfaces the leads to the outside. The method includes recessing the second surfaces of the leads or a bottom surface of the first encapsulant. The method includes electrically coupling a semiconductor die to the second conductive pattern. In a still further embodiment, exposing the first surfaces of the leads may include either a) removing a first portion of the first encapsulant or b) removing a lower portion of the main frame to remove the frame. In another embodiment, exposing the second surfaces of the leads may include either removing the lower portion of the main frame to remove the frame if step a) is used, or removing a second portion of the first encapsulant if step b) is used.

FIG. 1 is a flowchart illustrating a manufacturing or fabricating method for a semiconductor package, which includes a multi-layer encapsulated conductive substrate according to a first embodiment, and FIGS. 2A to 2M are cross-sectional views illustrating the manufacturing method of FIG. 1. In accordance with FIG. 1, the manufacturing method of a semiconductor package includes the steps of partially removing or half etching (S1), first encapsulating (S2), forming a first pattern layer (S3), forming conductive vias (S4), second encapsulating (S5), forming a second pattern layer (S6), material removal or back grinding (S7), etching or recessing (S8), and attaching a semiconductor die (S9). Hereinafter, the respective process steps of FIG. 1 will be described with reference to FIGS. 2A to 2M.

FIG. 2A illustrates a cross-sectional view of a conductive plate 110 or main frame 110 having a planar first surface 1101 (e.g., top surface) and a planar second surface 1102 (e.g., bottom surface) opposite to the first surface 1101, which is provided or prepared. In one embodiment, main frame 110 comprises a conductive material, such as a metal or metal alloy. In one preferred embodiment, main frame 110 comprises copper (Cu) and has a thickness in a range from approximately 100 microns through 200 microns. In accordance with step S1, a partial removal or half etching is performed on the main frame 110.

Next, as illustrated in FIG. 2B, in the step of partially removing or half etching (S1), the first surface 1101 of the main frame 110 is partially removed or half etched in a selective manner to form a plurality of leads 112 or conductive leads 112. For example, in the step (S1), a masking layer, such as photo resist, is formed on the first surface 1101 of the main frame 110, and a portion where the photo resist is not formed is half etched, thereby forming the leads 112. Accordingly, the main frame 110 includes a substantially plate-shaped frame 111 and the plurality of leads 112 upwardly protruding from the frame 111. Although the term half etched is used, it is understood that the height of leads 112 may be adjusted in accordance with application specifications such that the amount of material removed from main frame 110 may be more or less than half.

Figure 2D:
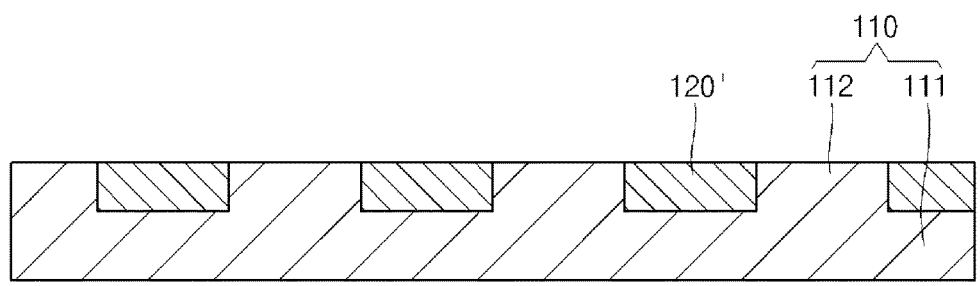

In the step of first encapsulating (S2), the top portion of the main frame 110 is encapsulated using a first encapsulant 120 and a top portion of the first encapsulant 120 is subsequently removed. As illustrated in FIG. 2C, in the step of first encapsulating (S2), the top portion of the main frame 110 is encapsulated using the first encapsulant 120 to cover the plurality of leads 112 of the main frame 110. Then, as illustrated in FIG. 2D, in the step of first encapsulating (S2), the first encapsulant 120 is partially removed thereby exposing the plurality of leads 112 to the outside of the first encapsulant 120. By way of example, the first encapsulant 120 can be partially removed using grinding techniques or other techniques as known to those of skill in the art. In one embodiment, a top portion of the removed first encapsulant 120' is substantially coplanar with top surfaces of the leads 112. The first encapsulant 120 may be a polymer composite material, such as an epoxy mold compound for performing encapsulation through a molding process, a liquid encapsulating member for performing encapsulation through a dispenser, or an equivalent thereof, but aspects of the present embodiment are not limited thereto.

Figure 2E:
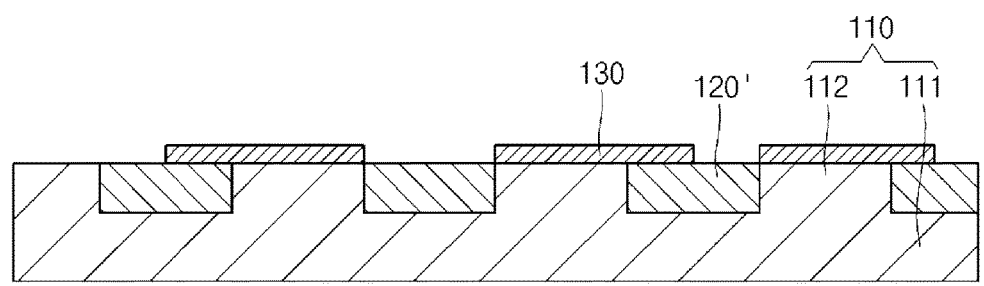

In the step of forming of the first pattern layer (S3), a first pattern layer 130, first patterned conductive layer 130, or first conductive layer 130 is formed on the top portion of the main frame 110. As illustrated in FIG. 2E, in the step of forming of the first pattern layer (S3), the first pattern layer 130 is formed on or adjacent to the leads 112 of the main frame 110. More particularly, in the step of forming of the first pattern layer (S3), the first pattern layer 130 is formed to be electrically connected to the leads 112. The first pattern layer 130 may be formed to extend from the top surfaces of the leads 112 to or overlapping onto the top surface of the first encapsulant 120'. In one embodiment, the first conductive pattern 130 may be made of a conductive material comprising copper (Cu) or other materials as known to those of skill in the art. In addition, the first pattern layer 130 may be formed by physical vapor deposition (PVD), chemical vapor deposition (CVD), metal sputtering, metal evaporation, electrolytic or electroless plating or other formation techniques as known to those of skill in the art. In one embodiment, the first pattern layer 130 has a thickness in a range from approximately 5 microns through 30 microns. After deposition, the conductive material may be patterned by physical etching or chemical etching, or other techniques as known to those of skill in the art to provide the first pattern layer 130.

Figure 2F:
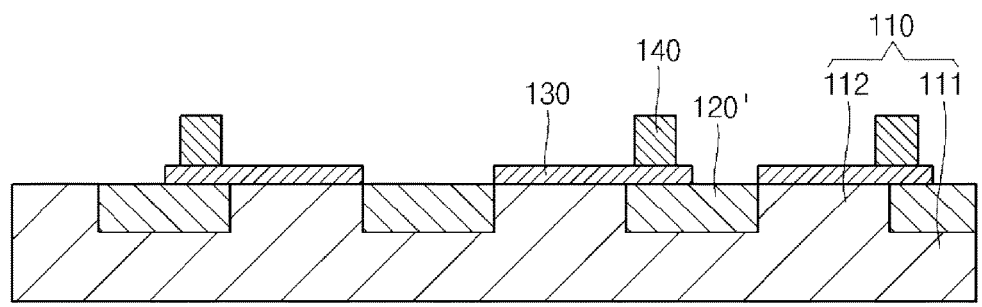

In the step of forming conductive vias (S4), vias 140, conductive vias 140, conductive structures 140, conductive pillars 140, or conductive pillar structures 140 are formed on the first pattern layer 130 as illustrated in FIG. 2F. The conductive vias 140 may be formed using PVD, CVD, metal sputtering, metal evaporation, electrolytic or electroless plating or other formation techniques as known to those of skill in the art. In one embodiment, the conductive vias 140 have a thickness in a range from approximately 15 microns through 100 microns. In one embodiment, electrolytic or electroless plating techniques are used with a masking layer provided over the first major surface 1101 and having a preselected pattern for forming the conductive vias 140 over the main frame 110 in desired locations. In one embodiment, the conductive vias 140 have a different width than the first pattern layer 130. The conductive vias 140 may be formed on a portion of the first pattern layer 130 extending to or overlapping onto the top surface of the first encapsulant 120'. Therefore, the conductive vias 140 are electrically connected to the leads 112 of the main frame 110 through the first pattern layer 130. The conductive vias 140 may be made of copper (Cu), like the main frame 110 and the first pattern layer 130, or may be made of other conductive materials as known to those of skill in the art.

Figure 2G:
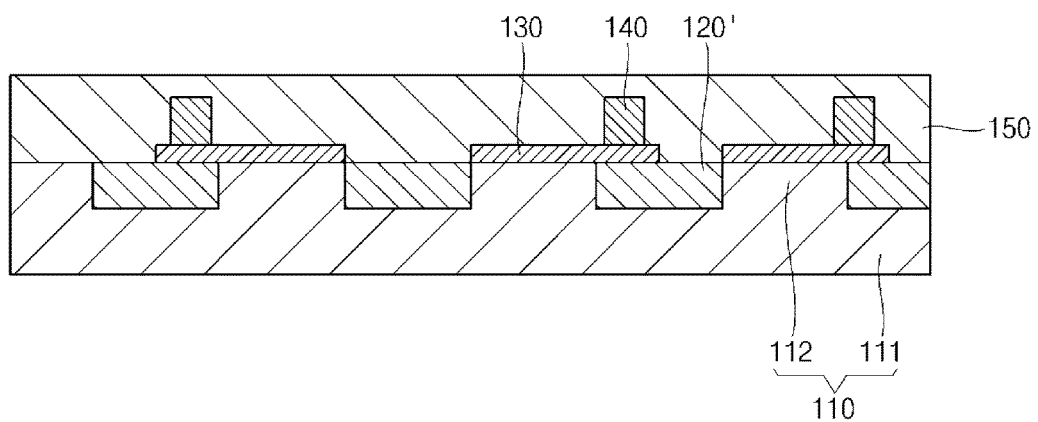
Figure 2H:
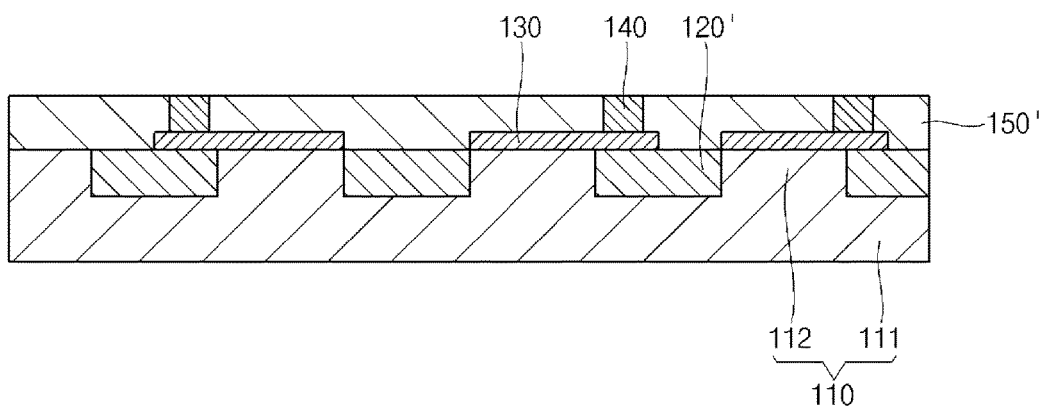

In the step of second encapsulating (S5), the conductive vias 140 and the first pattern layer 130 are encapsulated using a second encapsulant 150 and a top portion of the second encapsulant 150 is removed. As illustrated in FIG. 2G, in the step of second encapsulating (S5), the top portion of the main frame 110 is encapsulated using the second encapsulant 150 to cover the conductive vias 140 and the first pattern layer 130. In one embodiment, the second encapsulant 150 is formed on the first encapsulant 120'. Then, as illustrated in FIG. 2H, in the second encapsulating (S5), a portion the second encapsulant 150 is removed, thereby exposing the conductive vias 140 to the outside. In one embodiment, a grinding process is used to form a top surface of the second encapsulant 150' that is substantially coplanar with the top surfaces of the conductive vias 140. In some embodiments, the second encapsulant 150 may be a polymer composite material, such as an epoxy mold compound for performing encapsulation through a molding process, a liquid encapsulating member for performing encapsulation through a dispenser, or an equivalent thereof, but aspects of the present embodiment are not limited thereto. The second encapsulant 150 may be the same material or a different material than that of the first encapsulant 120. In accordance with the present embodiment, the first encapsulant 120 and the second encapsulant 150 are distinct material regions.

Figure 2I:
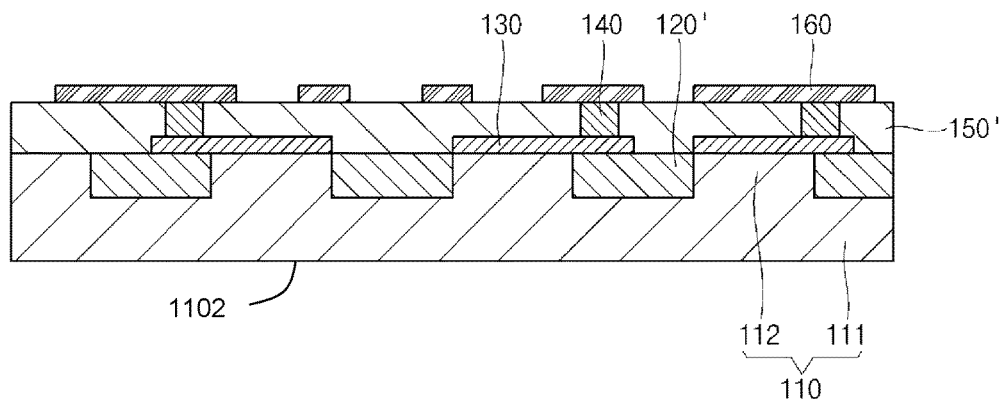

In the step of forming of the second pattern layer (S6), a second pattern layer 160, second patterned conductive layer 160, or second conductive layer 160 is formed on or adjacent to the conductive vias 140 as illustrated in FIG. 2I. More particularly, in the step of forming of the second pattern layer (S6), the second pattern layer 160 is provided or formed to be electrically connected to the conductive vias 140. The second pattern layer 160 may be formed by extending from top portions of the conductive vias 140 to or overlapping onto the top surface of the second encapsulant 150'. The second pattern layer 160 is electrically connected to the first pattern layer 130 and the leads 112 of the main frame 110 through the conductive vias 140. The second pattern layer 160 may be made of copper (Cu), like the first pattern layer 130 and the main frame 110. In addition, the second pattern layer 160 may be formed by physical vapor deposition (PVD), chemical vapor deposition (CVD), metal sputtering, metal evaporation, electrolytic or electroless plating or other formation techniques as known to those of skill in the art. In one embodiment, the second pattern layer 160 has a thickness in a range from approximately 5 microns through 30 microns. After deposition, the conductive material may be patterned by physical etching or chemical etching, or other techniques as known to those of skill in the art to provide the second pattern layer 160.

Figure 2J:
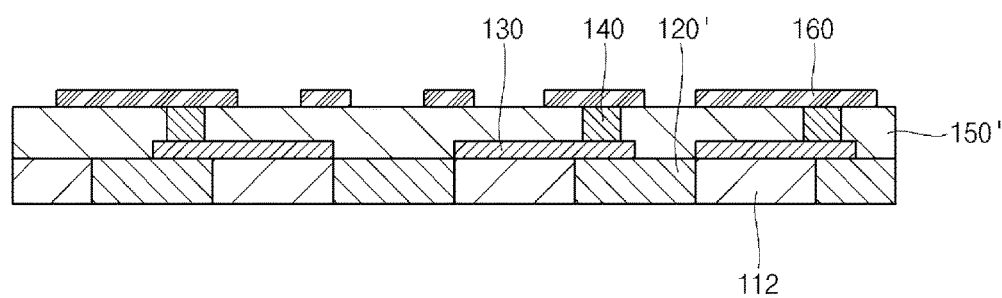

In the step of material removal or back grinding (S7), the second surface 1102 of the main frame 110 is removed using, for example, a back grind or grinding process. As illustrated in FIG. 2J, in the step of material removal or back grinding (S7), the second surface 1102 of the main frame 110 is subject to a removal process to remove the frame 111. Accordingly, in the step of material removal or back grinding (S7), the first encapsulant 120' and the leads 112 are exposed to the outside. In one embodiment, the bottom surfaces of the first encapsulant 120' and the leads 112 are substantially coplanar.

Figure 2K:
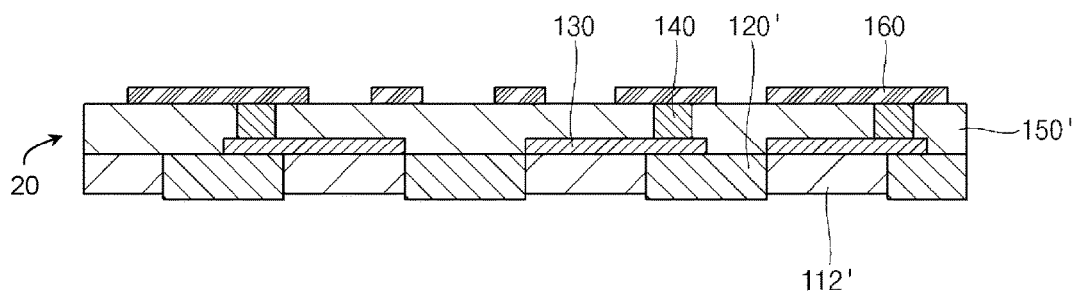

In the step of etching or recessing (S8), the first encapsulant 120' or the leads 112 exposed to the outside after the step of material removal (S7) are etched (i.e., reduced in thickness). As illustrated in FIG. 2K, in one embodiment in the step of etching (S8), the bottom surfaces of the leads 112 may be reduced in thickness. Accordingly, the first encapsulant 120' may downwardly protrude relative to the etched leads 112'. In one embodiment, conductive structures, such as solder structures or balls to be described later, may be attached to the leads 112', which have their lower surfaces etched or recessed in the step of etching (S8). In accordance with the present embodiment, an embodiment of a multi-layer encapsulated conductive substrate 20 is provided as illustrated in FIG. 2K. In one embodiment, the multi-layer encapsulated conductive substrate 20 may be prepared in advance of final assembly steps and may include the leads 112', the first encapsulant 120', the first pattern layer 130, the conductive vias 140, the second encapsulant 150', and the second pattern layer 160.

Figure 2L:
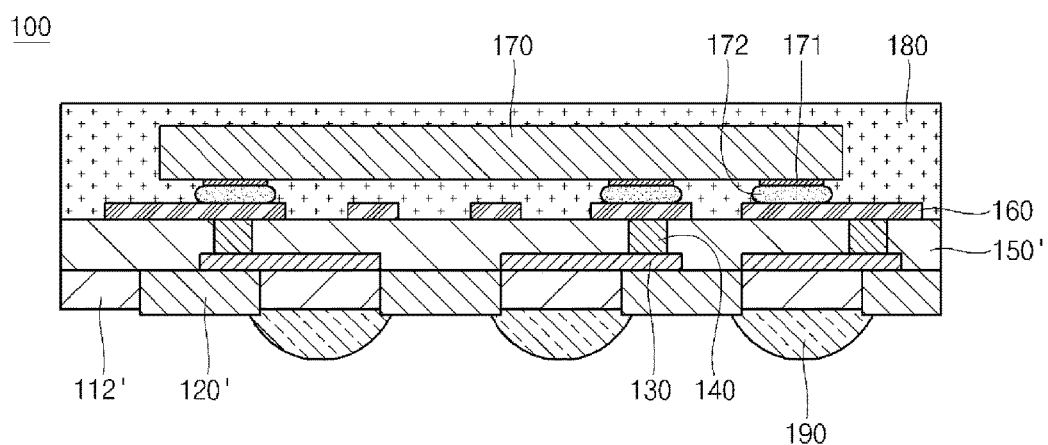

In the step of attaching the semiconductor die (S9), a semiconductor die 170 is electrically connected to the second pattern layer 160. As illustrated in FIG. 2L, in one embodiment the semiconductor die 170 may be attached to the second pattern layer 160. In one embodiment, the semiconductor die 170 comprises a silicon material and a plurality of semiconductor devices are formed in the semiconductor die 170. In one embodiment, a plurality of conductive pads 171 are formed on a major surface, such as the bottom surface of the semiconductor die 170, and conductive bumps 172 are formed on the conductive pads 171. In the step of attaching the semiconductor die (S9), the conductive bumps 172 may be connected to the second pattern layer 160. Therefore, the semiconductor die 170 is electrically connected to the second pattern layer 160, the conductive vias 140, the first pattern layer 130, and the leads 112'. In addition, in the step of attaching the semiconductor die (S9), after the semiconductor die 170 is attached, the semiconductor die 170 is encapsulated using an encapsulant 180. In some embodiments, the encapsulant 180 may be a polymer composite material, such as an epoxy mold compound for performing encapsulation through a molding process, a liquid encapsulating member for performing encapsulation through a dispenser, or an equivalent thereof, but aspects of the present embodiment are not limited thereto. The encapsulant 180 may be the same material or a different material than that of the second encapsulant 150 and/or first encapsulant 120. In accordance with one embodiment, the first encapsulant 120, the second encapsulant 150, and the encapsulant 180 are distinct material regions. In one embodiment, conductive structures, such as solder structures or balls 190 are attached to the leads 112' having recessed bottom surfaces. Accordingly, the semiconductor package 100 according to an embodiment of the present invention is formed by the above-described manufacturing method.

As described above, in the manufacturing method of the semiconductor package 100 in accordance with the present embodiment, the first pattern layer 130, the conductive vias 140 and the second pattern layer 160 are formed on the main frame 110 in advance, thereby achieving a micro lead frame structure having a fine pitch.

Figure 2M:
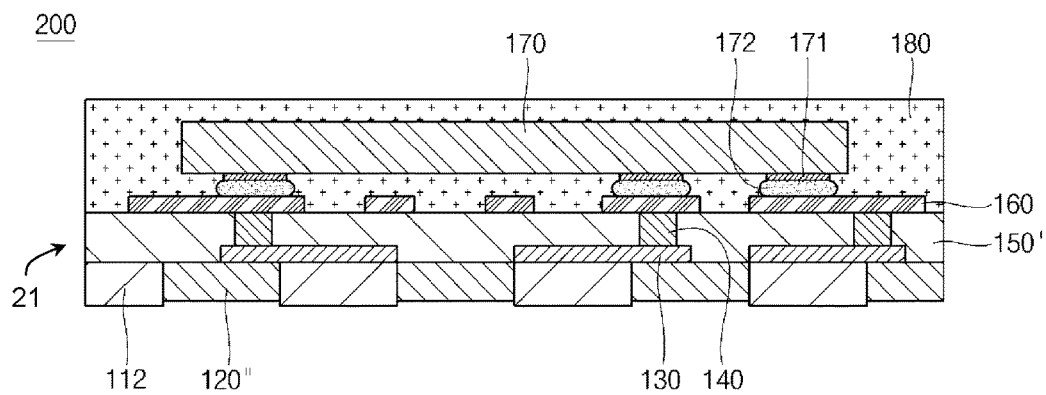

As illustrated in FIG. 2M, in the step of etching or recessing (S8), the first encapsulant 120' may be etched. Accordingly, the leads 112 may downwardly protrude relative to the etched first encapsulant 120". The leads 112 may serve as pads configured to directly attach to an external circuit without separate solder balls. The semiconductor die 170 illustrated in FIG. 2L is attached to the top portions of the leads 112 and is encapsulated using the encapsulant 180, thereby forming a semiconductor package 200 according to another embodiment. In accordance with the present embodiment, FIG. 2M illustrates an alternative embodiment of a multi-layer encapsulated conductive substrate 21, which may prepared in advance of final assembly steps and may include the leads 112, the first encapsulant 120", the conductive vias 140, the second encapsulant 150', and the second pattern layer 160.

As described above, in the manufacturing method of the semiconductor package 200 in accordance with another embodiment, since the leads 112 of the main frame 110 serve as pads, separate conductive structures, such as solder balls are not required, thereby saving manufacturing costs and reducing the size (e.g., the height) of the semiconductor package 200.

FIGS. 3A to 3M are cross-sectional views illustrating a manufacturing or fabricating method of a semiconductor package, which includes a multi-layer encapsulated conductive substrate according to another embodiment. In this embodiment, the manufacturing method includes partially removing or half etching (S1), first encapsulating (S2), forming a first pattern layer (S3), forming conductive vias (S4), second encapsulating (S5), forming a second pattern layer (S6), material removal or back grinding (S7), etching or recessing (S8), and attaching a semiconductor die (S9), as illustrated in FIG. 1.

Figure 3A:
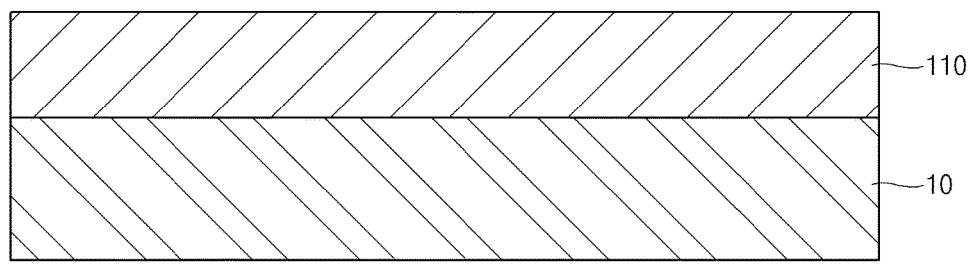
FIGS. 3A to 3M are cross-sectional views illustrating a manufacturing method of a semiconductor package according to another embodiment of the present invention.
Figure 3B:
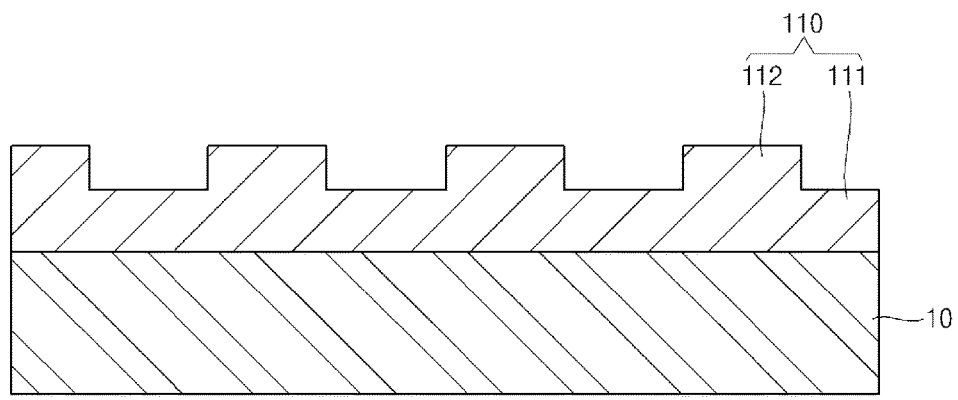
Figure 3C:
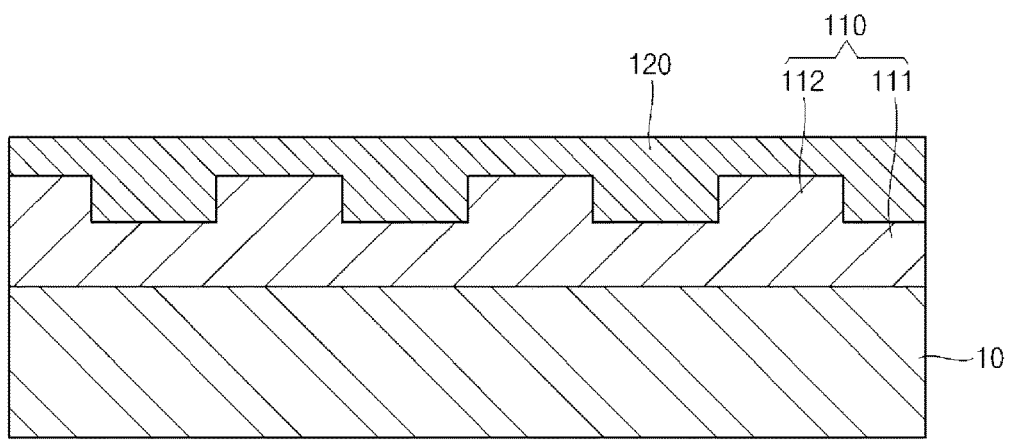
Figure 3D:
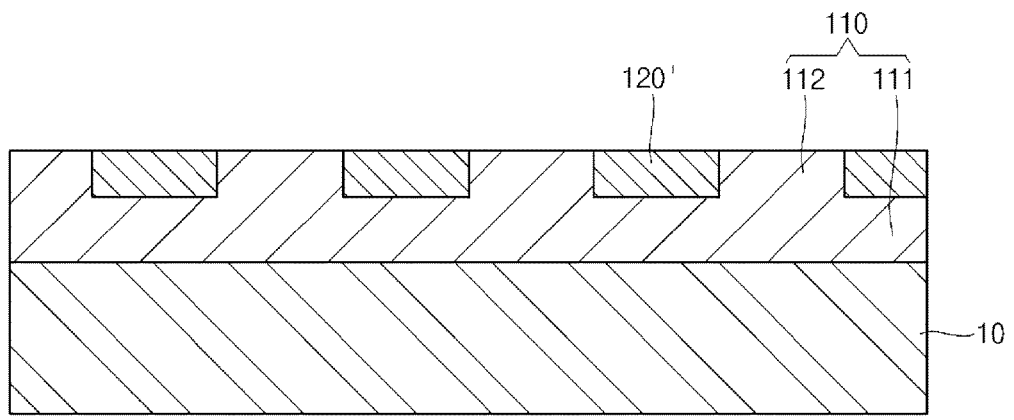
Figure 3E:
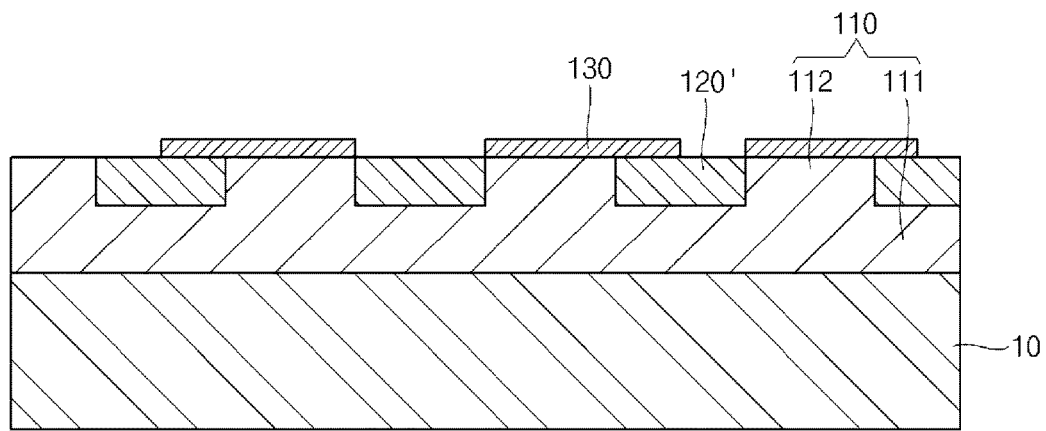
Figure 3F:
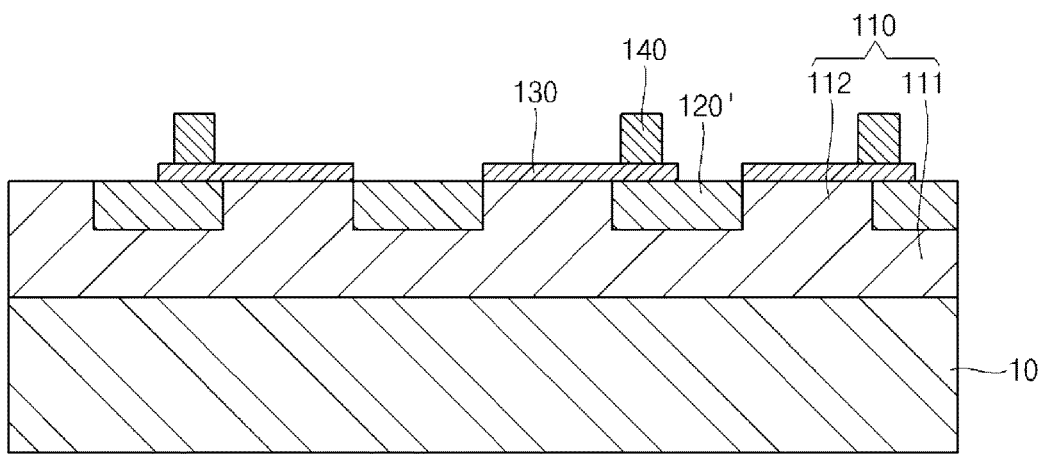
Figure 3G:
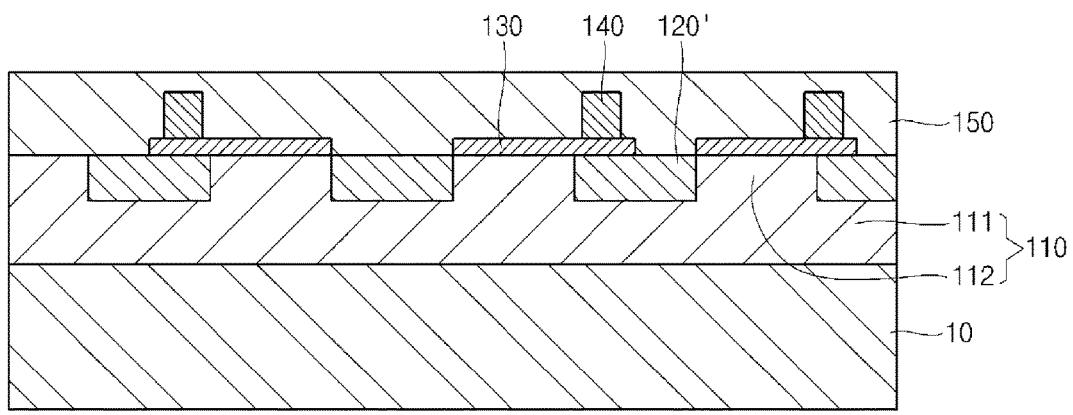
Figure 3H:
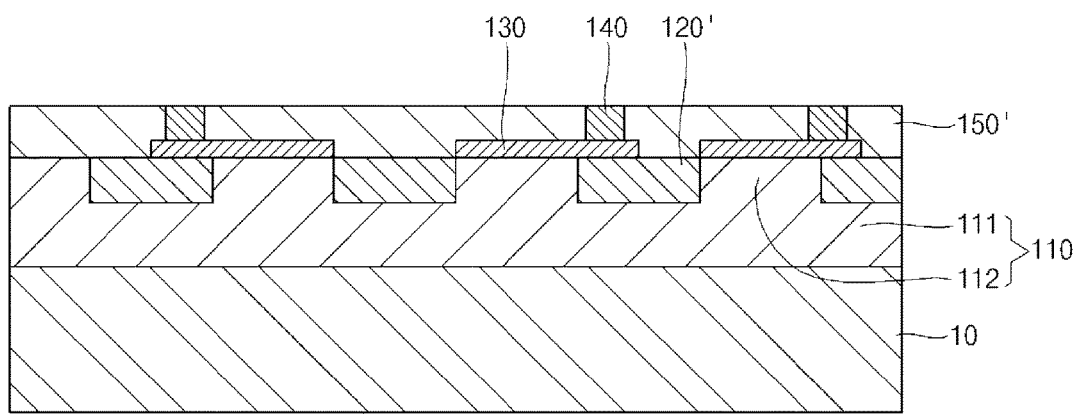
Figure 3I:
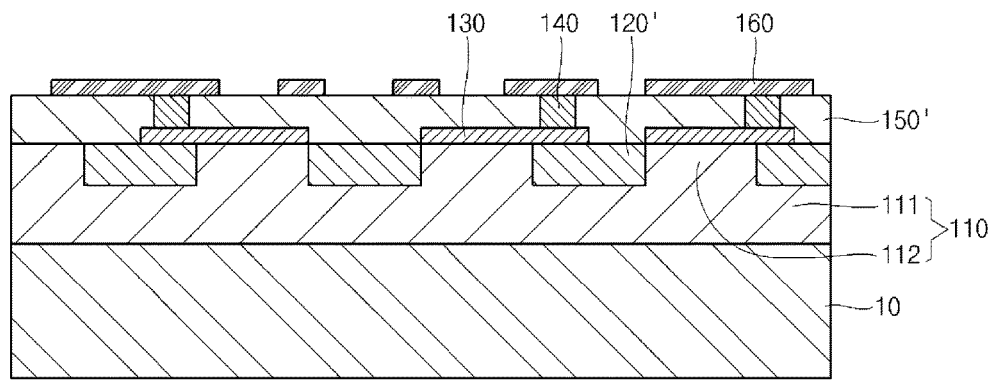
Figure 3J:
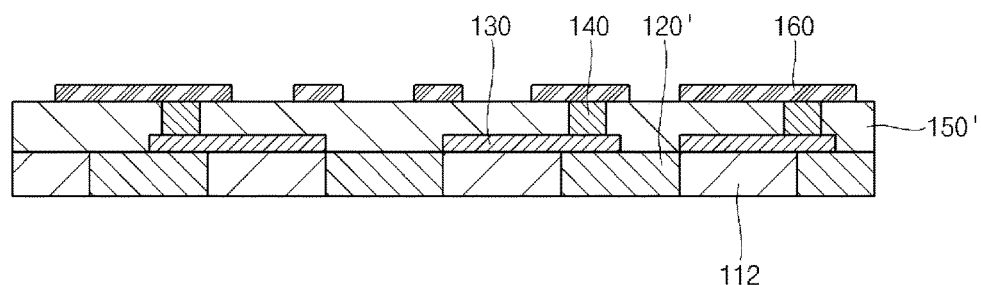

The manufacturing method of the semiconductor package illustrated in FIGS. 3A to 3M is similar to the manufacturing method of the semiconductor package illustrated in FIGS. 2A to 2M. However, as illustrated in FIG. 3A, the present manufacturing method is accomplished having the main frame 110 attached to a carrier 10 or carrier substrate 10. The carrier 10 may be made of copper (Cu), a glass, silicon (Si), or other materials as known to those of skill in the art. In accordance with the present embodiment, the carrier 10 facilitates, for example, easier transfer of the main frame 110 to subsequent processing steps. As illustrated in FIGS. 3A to 3I, the carrier 10 may be used to transfer the main frame 110 to manufacturing steps of partially removing or half etching (S1), of first encapsulating (S2), of forming of the first pattern layer (S3), of forming of the conductive vias (S4), of second encapsulating (S5) and of forming of the second pattern layer (S6). In one embodiment as illustrated in FIG. 3J, the carrier 10 may be removed before the bottom surface of the main frame 110 is removed in step of material removal or back grinding (S7).

Figure 3K:
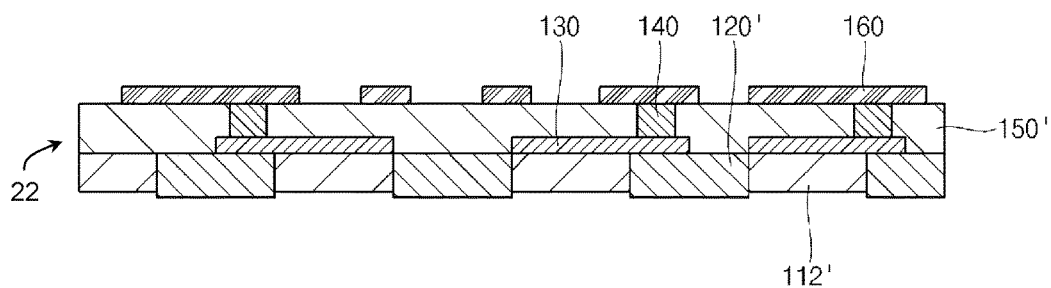
Figure 3L:
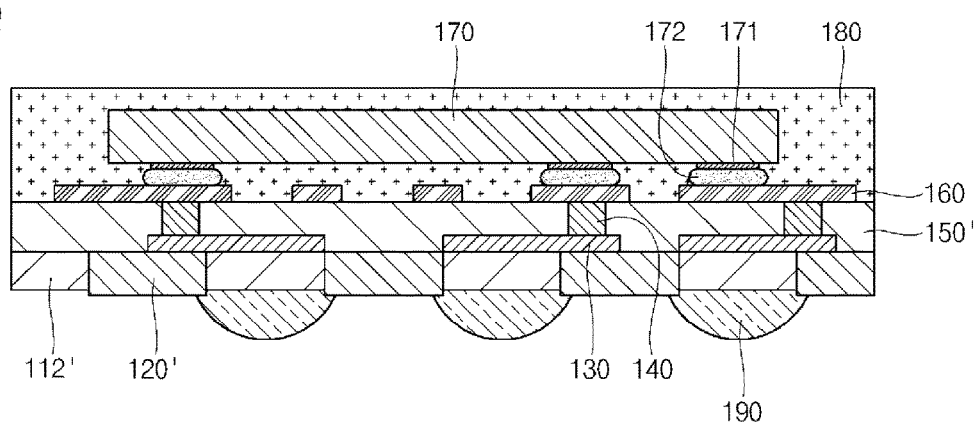
Figure 3M:
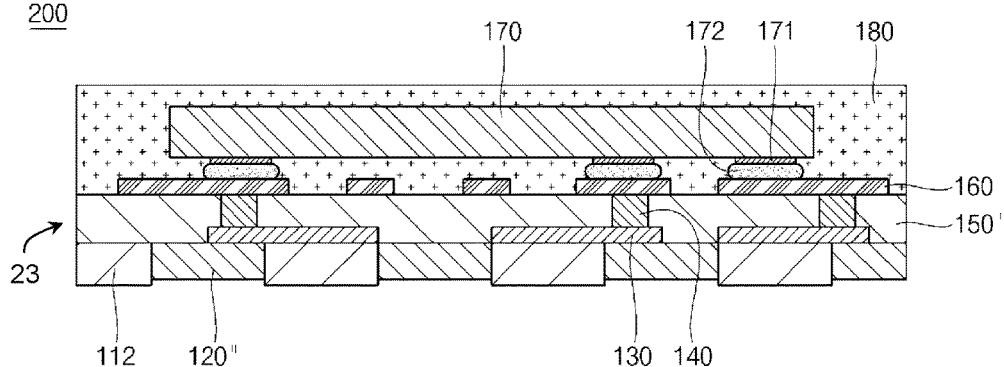

As described above, the manufacturing method of the semiconductor package according to the present embodiment is substantially the same as the manufacturing method of the semiconductor package illustrated in FIGS. 2A to 2M, except that the main frame 110 is attached to the carrier 10 during manufacturing, and detailed descriptions of the other process steps described in FIGS. 2A to 2M will not be repeated here. In accordance with the present embodiment, an embodiment of a multi-layer encapsulated conductive substrate 22 is provided as illustrated in FIG. 3K, which may be prepared in advance of final assembly steps and may include the leads 112', the first encapsulant 120', the first pattern layer 130, the conductive vias 140, the second encapsulant 150', and the second pattern layer 160. FIG. 3M illustrates an alternative embodiment of a multi-layer encapsulated conductive substrate 23, which may be prepared in advance of final assembly steps and may include the leads 112, the first encapsulant 120", the conductive vias 140, the second encapsulant 150', and the second pattern layer 160.

Figure 4:
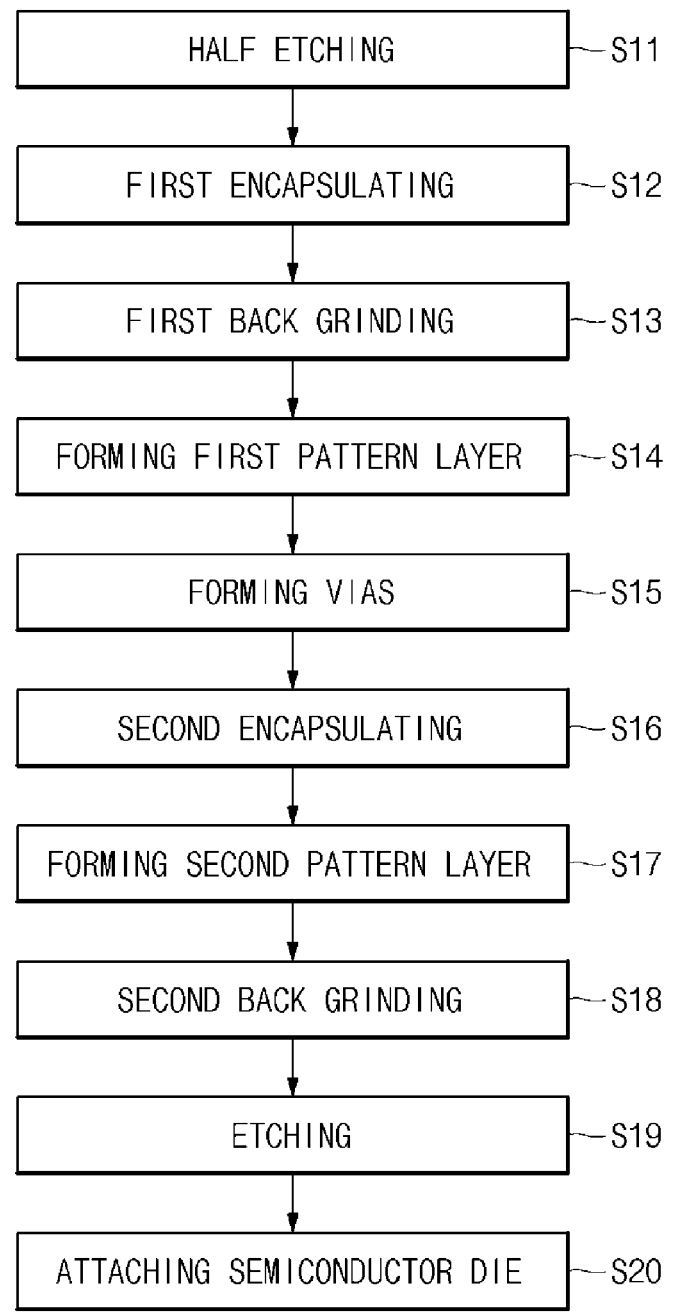
FIG. 4 is a flowchart illustrating a manufacturing method of a semiconductor package according to another embodiment of the present invention.

FIG. 4 is a flowchart illustrating a manufacturing or fabricating method of a semiconductor package, which includes a multi-layer encapsulated conductive substrate according to another embodiment. FIGS. 5A to 5M are cross-sectional views illustrating a manufacturing method of a semiconductor package according to the embodiment of FIG. 4. In accordance with FIG. 4, the manufacturing method of a semiconductor package includes the steps of partially removing or half etching (S11), first encapsulating (S12), first material removal or first back grinding (S13), forming a first pattern layer (S14), forming conductive vias (S15), second encapsulating (S16), forming a second pattern layer (S17), second material removal or second back grinding (S18), etching or recessing (S19) and attaching a semiconductor die (S20). Hereinafter, the respective process steps of FIG. 4 will be described with reference to FIGS. 5A to 5M.

Figure 5A:
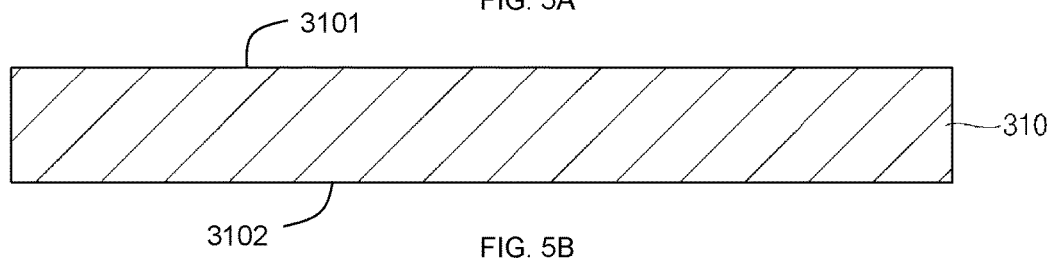
FIGS. 5A to 5M are cross-sectional views illustrating a manufacturing method of a semiconductor package according to the embodiment of FIG. 4.

FIG. 5A illustrates a cross-sectional view of a conductive plate 310 or main frame 310 having a planar first surface 3101 (e.g., top surface) and a planar second surface 3102 (e.g., bottom surface) opposite to the first surface, which is provided or prepared. In one embodiment, main frame 310 comprises a conductive material, such as a metal or metal alloy. In one preferred embodiment, main frame 310 comprises copper (Cu). In accordance with step S11, a partial removal or half etching is done to the main frame 310.

Figure 5B:
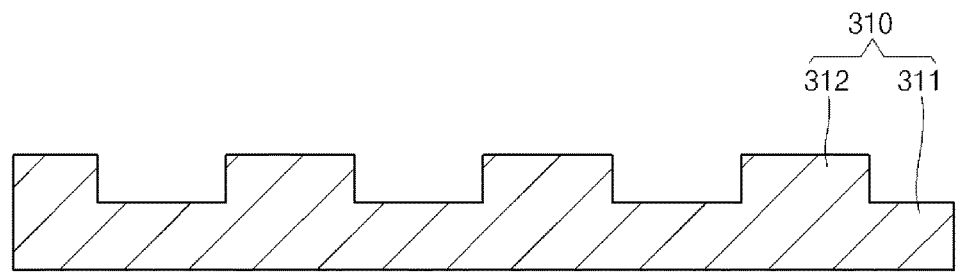

Next, as illustrated in FIG. 5B, in the step of partially removing or half etching (S11), the first surface 3101 of the main frame 110 is partially removed or half etched in a selective manner to form a plurality of leads 312. Accordingly, the main frame 310 includes a substantially plate-shaped frame 311 and the plurality of leads 312 upwardly protruding from the frame 311. For example, in the step (S11), a masking layer, such as photo resist, is formed on the first surface 3101 of the main frame 310, and a portion where the photo resist is not formed is half etched, thereby forming the leads 312. Although the term half etched is used, it is understood that the height of leads 312 may be adjusted in accordance with application specifications such that the amount of material removed from main frame 310 may be more or less than half.

Figure 5C:
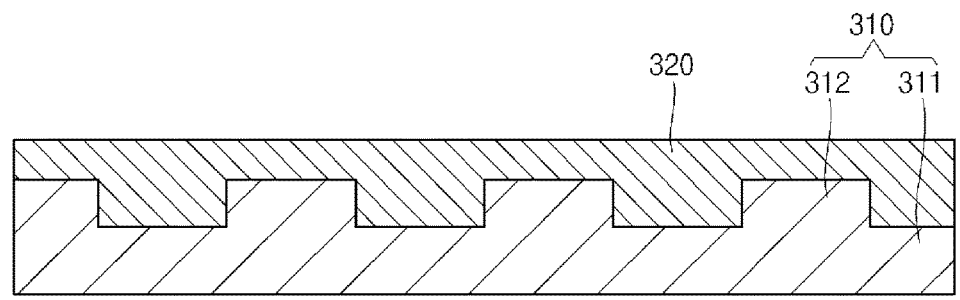

In the step of first encapsulating (S12), the top portion of the main frame 310 is encapsulated using a first encapsulant 320. As illustrated in FIG. 5C, in the step of first encapsulating (S12), the top portion of the main frame 310 is encapsulated using the first encapsulant 320 to cover the plurality of leads 312 of the main frame 310. The first encapsulant 320 may be a polymer composite material, such as an epoxy mold compound for performing encapsulation through a molding process, a liquid encapsulating member for performing encapsulation through a dispenser, or an equivalent thereof, but aspects of the present embodiment are not limited thereto.

Figure 5D:
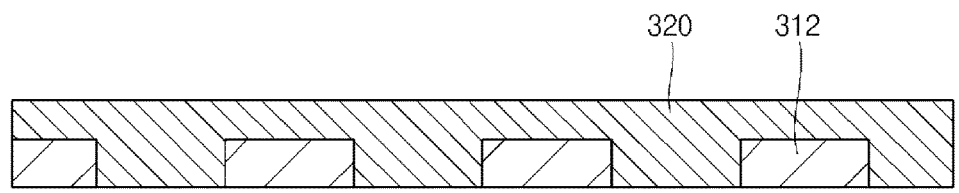

In the step of first material removal or first back grinding (S13), the second surface of the main frame 310 is removed. As illustrated in FIG. 5D, in the step of first material removal (S13), the frame 311 is removed from the second surface 3102 of the main frame 310. In one embodiment, a back grinding process is used to remove the frame 311. Accordingly, in the step of first material removal or first back grinding (S13), the first encapsulant 320 and the leads 312 are exposed to the outside after the frame 311 is removed. In one embodiment, in the step of first material removal or first back grinding (S13), since the second surface of the main frame 310 is removed or thinned the first encapsulant 320 and the leads 312 are substantially coplanar.

Figure 5E:
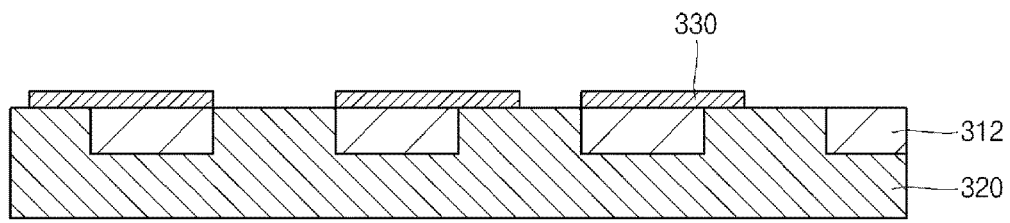

In the step of forming of the first pattern layer (S14), a first pattern layer 330, first patterned conductive layer 330, or first conductive layer 330 is formed on or adjacent to the leads 312. First, as illustrated in FIG. 5E, in the step of forming of the first pattern layer (S14), the main frame 310 is turned-over to allow first surfaces of the leads 312 exposed to the outside through the step of first back grinding (S13) to face upward. Accordingly, in one embodiment the first surfaces of the leads 312 exposed to the outside may face upward. Then, the first pattern layer 330 is formed on or adjacent to the leads 312. More particularly, in the forming of the first pattern layer (S14), the first pattern layer 330 is provided to be electrically connected to the leads 312. In one embodiment, the first pattern layer 330 may be formed to extend from top portions of the leads 312 to or overlapping onto a top portion of the first encapsulant 320. In one embodiment, the first conductive pattern 330 may be made of a conductive material comprising copper (Cu) or other materials as known to those of skill in the art. In addition, the first pattern layer 330 may be formed by physical vapor deposition (PVD), chemical vapor deposition (CVD), metal sputtering, metal evaporation, electrolytic or electroless plating or other formation techniques as known to those of skill in the art. In one embodiment, the first pattern layer 330 has a thickness in a range from approximately 5 microns through 30 microns. After deposition, the conductive material may be patterned by physical etching or chemical etching, or other techniques as known to those of skill in the art to provide the first pattern layer 330.

Figure 5F:
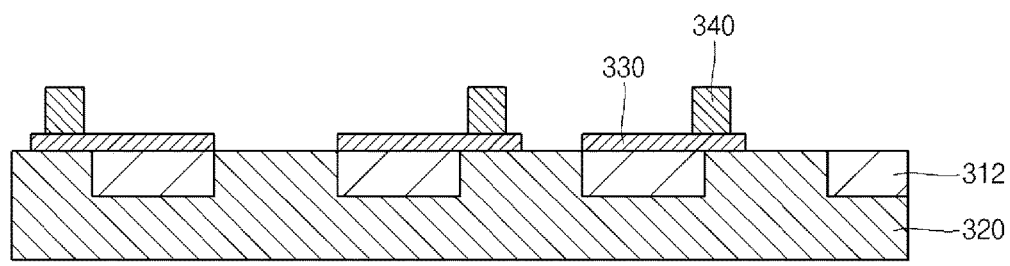

In the step of forming the conductive vias (S15), vias 340, conductive vias 340, conductive via structures 340, conductive pillars 340, or conductive pillar structures 340 are formed on the first pattern layer 330 as illustrated in FIG. 5F. In one embodiment, in the step of forming the conductive vias (S15), the conductive vias 340 are formed on the first pattern layer 330. The conductive vias 340 may be formed using PVD, CVD, metal sputtering, metal evaporation, electrolytic or electroless plating or other formation techniques as known to those of skill in the art. In one embodiment, the conductive vias 340 have a thickness in a range from approximately 15 microns through 100 microns. In one embodiment, electrolytic or electroless plating techniques are used with a masking layer provided over the first pattern layer 330 and having a preselected pattern for forming the conductive vias 340 over the main frame 310 in desired locations. In one embodiment, the conductive vias 340 have a different width than the first pattern layer 330. In one embodiment, the conductive vias 340 may be formed on a portion of the first pattern layer 330 extending to overlaps the top surface of the first encapsulant 320. Therefore, the conductive vias 340 are electrically connected to the leads 312 of the main frame 310 through the first pattern layer 330. The conductive vias 340 may be made of copper (Cu), like the main frame 310 and the first pattern layer 330.

Figure 5G:
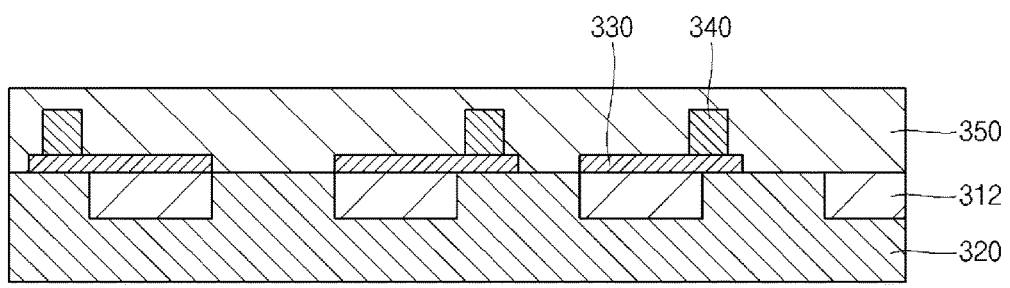

In the step of second encapsulating (S16), the conductive vias 340 and the first pattern layer 330 are encapsulated using a second encapsulant 350 and a top portion of the second encapsulant 350 is removed using, for example, a grinding process. As illustrated in FIG. 5G, in the step of second encapsulating (S16), the top portions of the leads 312 are encapsulated using the second encapsulant 350 to cover the conductive vias 340 and the first pattern layer 330. In accordance with the present embodiment, the second encapsulant 350 is formed on and adjoining portions of the first encapsulant 320. In some embodiments, the second encapsulant 350 may be a polymer composite material, such as an epoxy mold compound for performing encapsulation through a molding process, a liquid encapsulating member for performing encapsulation through a dispenser, or an equivalent thereof, but aspects of the present embodiment are not limited thereto. The second encapsulant 350 may be the same material or a different material than that of the first encapsulant 320. In accordance with the present embodiment, the first encapsulant 320 and the second encapsulant 350 are distinct material regions.

Figure 5H:
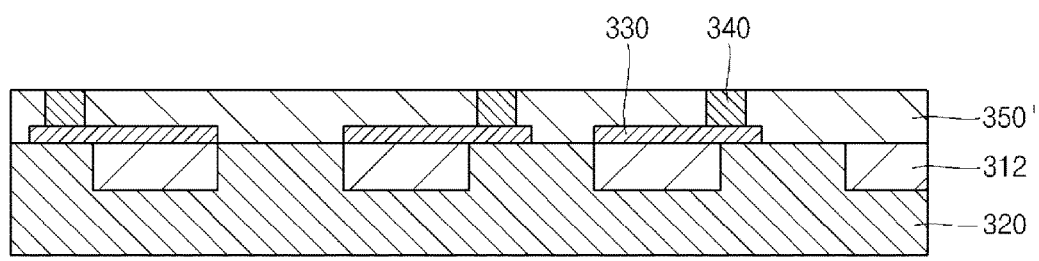

Then, as illustrated in FIG. 5H, in the step of second encapsulating (S16), part of the top portion of the second encapsulant 350 is removed to expose the conductive vias 340 to the outside. In one embodiment, a grinding process is used. In one embodiment, after the removal step the top surface of the thinned second encapsulant 350' is substantially coplanar with the top surfaces of the conductive vias 340.

Figure 5I:
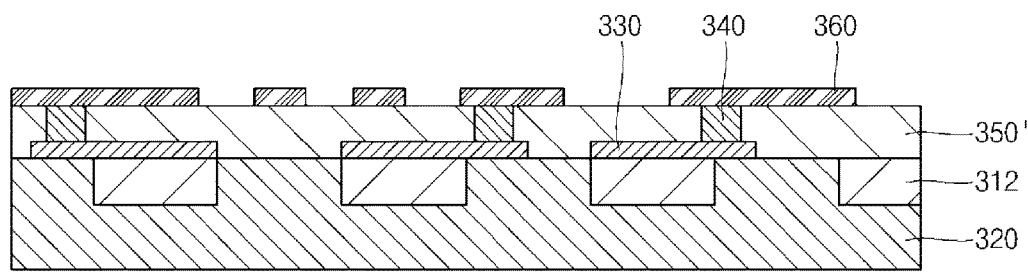

In the step of forming of the second pattern layer (S17), a second pattern layer 360, second patterned conductive layer 360, or second conductive layer 360 is formed on or adjacent to the conductive vias 340 as illustrated in FIG. 5I. More particularly, in the step of forming the second pattern layer (S17), the second pattern layer 360 is provided or formed to be electrically connected to the conductive vias 340. The second pattern layer 360 may be formed by extending from top portions of the conductive vias 340 to or overlapping onto the top surface of the second encapsulant 350'. The second pattern layer 360 is electrically connected to the first pattern layer 330 and the leads 312 of the main frame 310 through the conductive vias 340. The second pattern layer 360 may be formed through a plating process. In addition, the second pattern layer 360 may be made of copper (Cu), like the first pattern layer 330 and the main frame 310. In addition, the second pattern layer 360 may be formed by physical vapor deposition (PVD), chemical vapor deposition (CVD), metal sputtering, metal evaporation, electrolytic or electroless plating or other formation techniques as known to those of skill in the art. In one embodiment, the second pattern layer 360 has a thickness in a range from approximately 5 microns through 30 microns. After deposition, the conductive material may be patterned by physical etching or chemical etching, or other techniques as known to those of skill in the art to provide the second pattern layer 360.

Figure 5J:
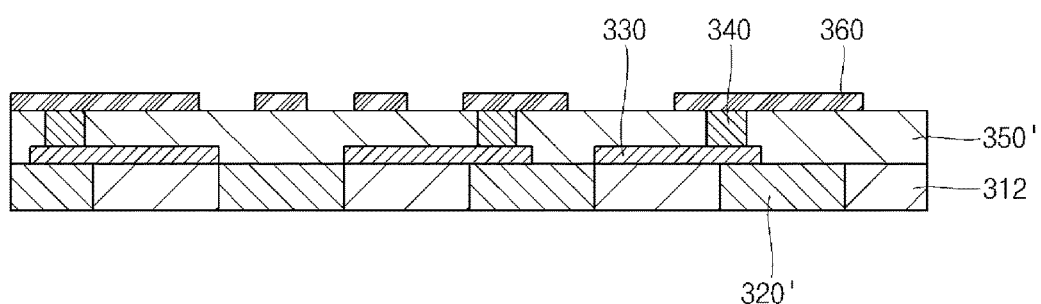

In the step of second material removal or second back grinding (S18), the bottom surface of the first encapsulant 320 is removed using, for example, a grinding process. As illustrated in FIG. 5J, in the step of second material removal or second back grinding (S18), the bottom surface of the first encapsulant 320 is remove to expose the leads 312 to the outside of the first encapsulant 320'. In one embodiment, after the second removal step a bottom surface of the first encapsulant 320' is substantially coplanar with the bottom surfaces of the leads 312.

Figure 5K:
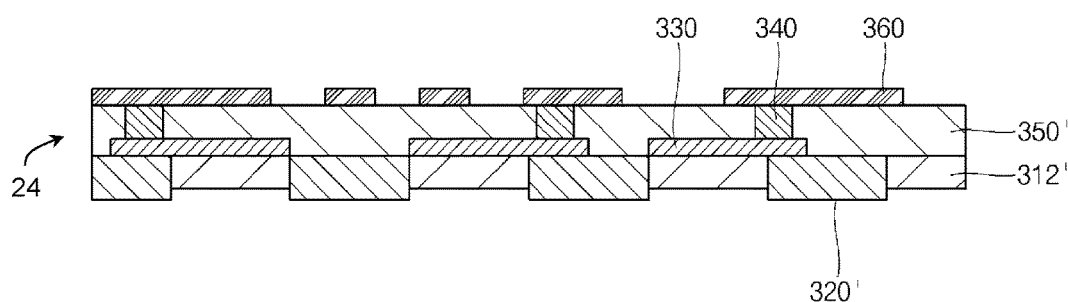

In the step of etching or recessing (S19), the exposed first encapsulant 320' or the exposed leads 312 are etched or recessed with respect to each other. In one embodiment, as illustrated in FIG. 5K, in the step of etching (S19), bottom surfaces of the leads 312 may be etched or thinned. In accordance with this embodiment, the first encapsulant 320' may downwardly protrude relative to the leads 312' whose bottom surfaces are etched or thinned, and conductive structures, such as solder structures or balls to be described later, may be attached to the leads 312', which have their lower surfaces etched or recessed in the step of etching (S19). In accordance with the present embodiment, an embodiment of a multi-layer encapsulated conductive substrate 24 is provided as illustrated in FIG. 5K. In one embodiment, the multi-layer conductive substrate 24 may be prepared in advance of final assembly steps and may include the leads 312', the first encapsulant 320', the first pattern layer 330, the conductive vias 340, the second encapsulant 350', and the second pattern layer 360.

Figure 5L:
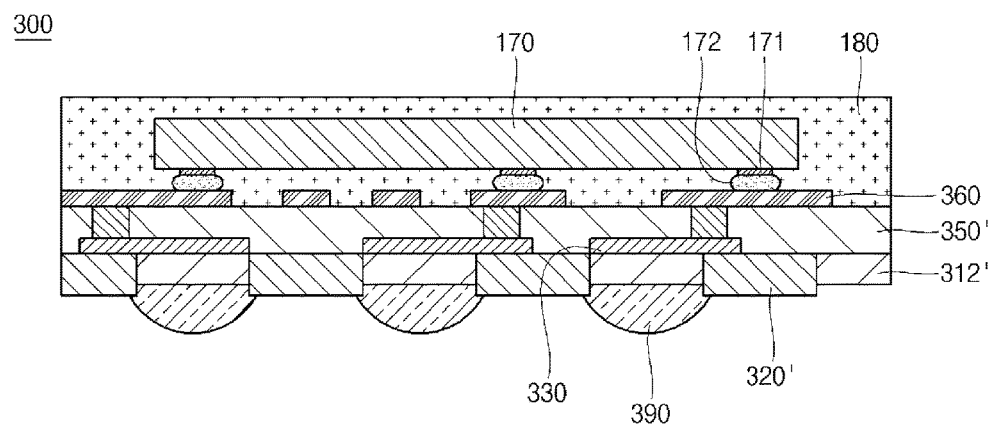

In the step of attaching the semiconductor die (S20), the semiconductor die 170 is electrically connected to the second pattern layer 360. As illustrated in FIG. 5L, in one embodiment the semiconductor die 170 is attached to the second pattern layer 360. In one embodiment, the semiconductor die 170 comprises a silicon material and a plurality of semiconductor devices are formed in the semiconductor die 170. In one embodiment, a plurality of conductive pads 171 are formed on a major surface, such as the bottom surface of the semiconductor die 170 and conductive bumps 172 are formed on the conductive pads 171. In the step of attaching the semiconductor die (S20), the conductive bumps 172 may be connected to the second pattern layer 360. Therefore, the semiconductor die 170 is electrically connected to the second pattern layer 360, the conductive vias 340, the first pattern layer 330 and the leads 312'. In addition, in the step of attaching the semiconductor die (S20), after the semiconductor die 170 is attached, the semiconductor die 170 is encapsulated using the encapsulant 180 as described previously. In one embodiment, conductive structures, such solder structures or balls 390 are attached to the leads 312' having recessed bottom surfaces. Accordingly, the semiconductor package 300 according to another embodiment is completed by the above-described manufacturing method.

Figure 5M:
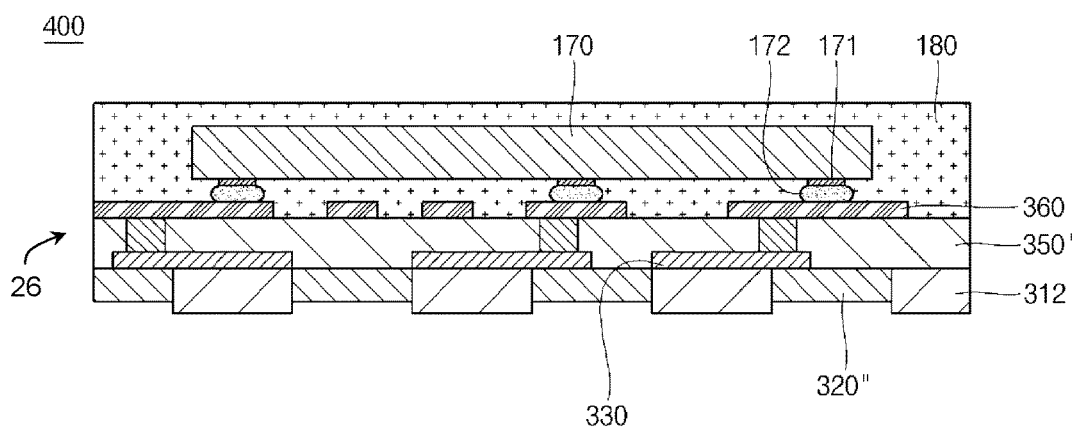

In an alternative embodiment, as illustrated in FIG. 5M, in the step of etching or recessing (S19), the first encapsulant 320' may be etched or thinned. Therefore, the leads 312 may downwardly protrude relative to the etched first encapsulant 320". In accordance with the present embodiment, the leads 312 may serve as pads configured to directly attach to an external circuit without separate conductive structures, such as solder balls. The semiconductor die 170 illustrated in FIG. 5M is attached to the top portions of the leads 312 and is encapsulated using the encapsulant 180 as described previously, thereby forming a semiconductor package 400 according to still another embodiment. In accordance with the present embodiment, FIG. 5M illustrates an alternative embodiment of a multi-layer encapsulated conductive substrate 26, which may be prepared in advance of final assembly steps and may include the leads 312, the first encapsulant 320", the conductive vias 340, the second encapsulant 350', and the second pattern layer 360.

FIG. 6 is a flowchart illustrating a manufacturing or fabricating method of a semiconductor package according to a further embodiment. FIGS. 7A to 7H are cross-sectional view illustrating a manufacturing method of a semiconductor package according to the embodiment of FIG. 6. In accordance with FIG. 6, the manufacturing method of a semiconductor package includes the steps of partially removing or half etching (S1), first encapsulating (S2), forming a first pattern layer (S3), forming conductive vias (S4), second encapsulating (S5), forming a second pattern layer (S6), forming conductive posts (S27), third encapsulating (S28), material removal or back grinding (S29), etching or recessing (S30) and attaching a semiconductor die (S31). Hereinafter, the respective process steps of FIG. 6 will be described with reference to FIGS. 7A to 7H.

In the present embodiment, the steps of partially removing or half etching (S1), first encapsulating (S2), forming of the first pattern layer (S3), forming of the conductive vias (S4), second encapsulating (S5) and forming of the second pattern layer (S6) are similar to those illustrated in FIG. 1 and FIGS. 2A to 2I, and detailed descriptions thereof will not be repeated here.

Figure 7A:
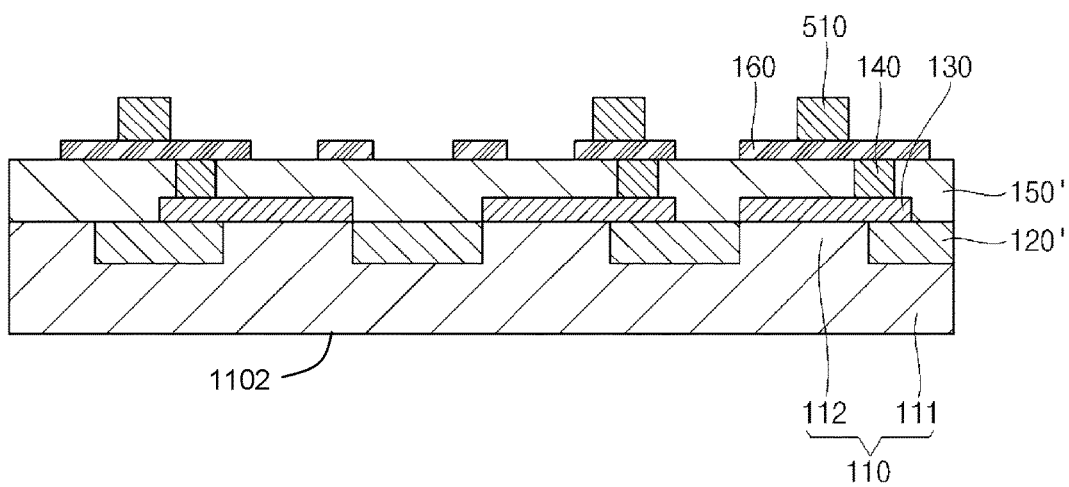
FIGS. 7A to 7H are cross-sectional views illustrating a manufacturing method of a semiconductor package according to the embodiment of FIG. 6.

In the step of forming of the conductive posts (S27), conductive posts 510 or conductive structures 510 are formed on the second pattern layer 160 as illustrated in FIG. 7A. In one embodiment, the conductive posts 510 are formed on the second pattern layer 160 through a plating process. Alternatively, the conductive posts 510 may be formed using PVD, CVD, metal sputtering, metal evaporation, or other formation techniques as known to those of skill in the art. In one embodiment, plating techniques are used with a masking layer provided over the second pattern layer 160 and having a preselected pattern for forming the conductive posts 510 over the second pattern layer 160 in desired locations. The conductive posts 510 may be formed on a portion of the second pattern layer 160 extending to or overlapping onto a top surface of the second encapsulant 150'. Therefore, the conductive posts 510 are electrically connected to the leads 112 through the second pattern layer 160, the conductive vias 140 and the first pattern layer 130. In one embodiment, the conductive posts 510 may be copper (Cu) posts. In one embodiment, the conductive posts 510 have a thickness in a range from approximately 15 microns through 100 microns.

Figure 7B:
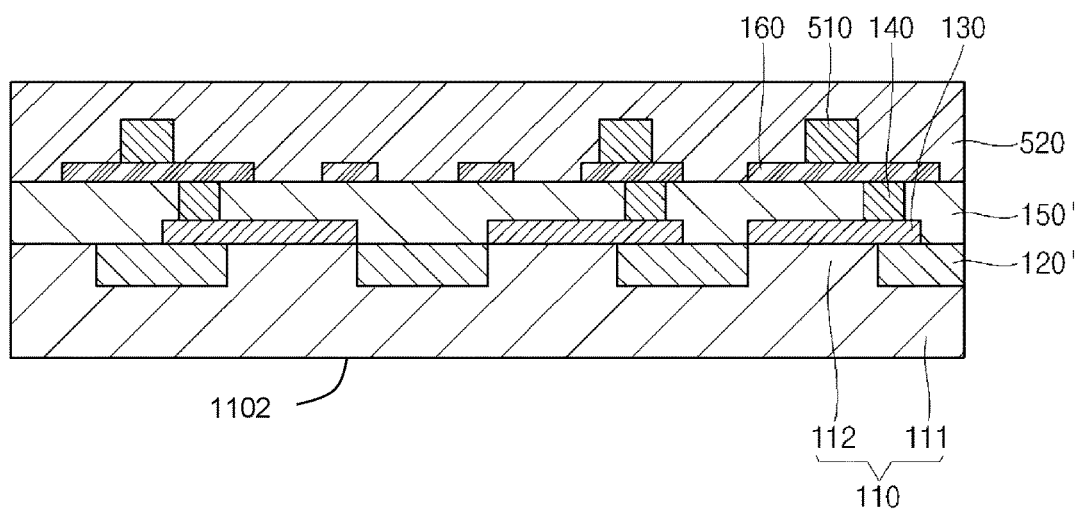

In the step of third encapsulating (S28), the conductive posts 510 and the second pattern layer 160 are encapsulated with a third encapsulant 520. In some embodiments, the third encapsulant 520 may be a polymer composite material, such as an epoxy mold compound for performing encapsulation through a molding process, a liquid encapsulating member for performing encapsulation through a dispenser, or an equivalent thereof, but aspects of the present embodiment are not limited thereto. The third encapsulant 520 may be the same material or a different material than that of the second encapsulant 150 and/or the first encapsulant 120. In accordance with the present embodiment, the first encapsulant 120, the second encapsulant 150, and the third encapsulant 520 are distinct material regions. As illustrated in FIG. 7B, in the step of third encapsulating (S28), the top portion of the second encapsulant 150' is encapsulated using the third encapsulant 520 to cover the conductive posts 510 and the second pattern layer 160.

Figure 7C:
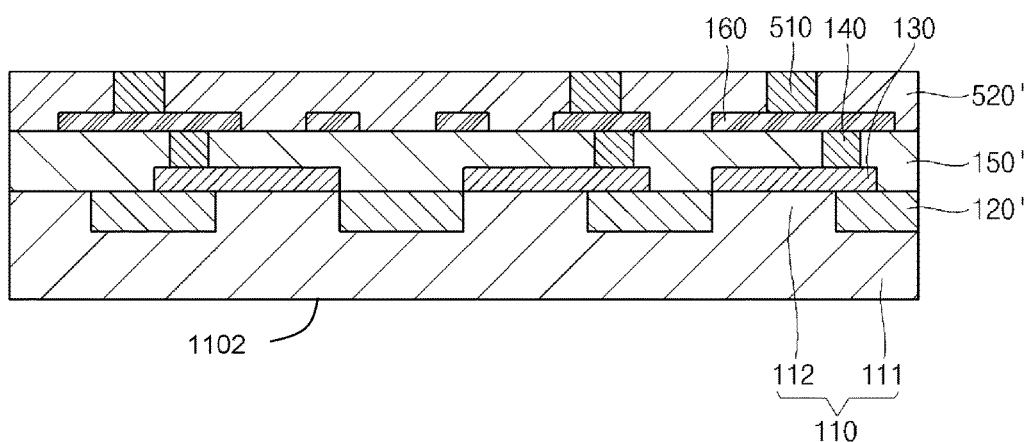
Figure 7D:
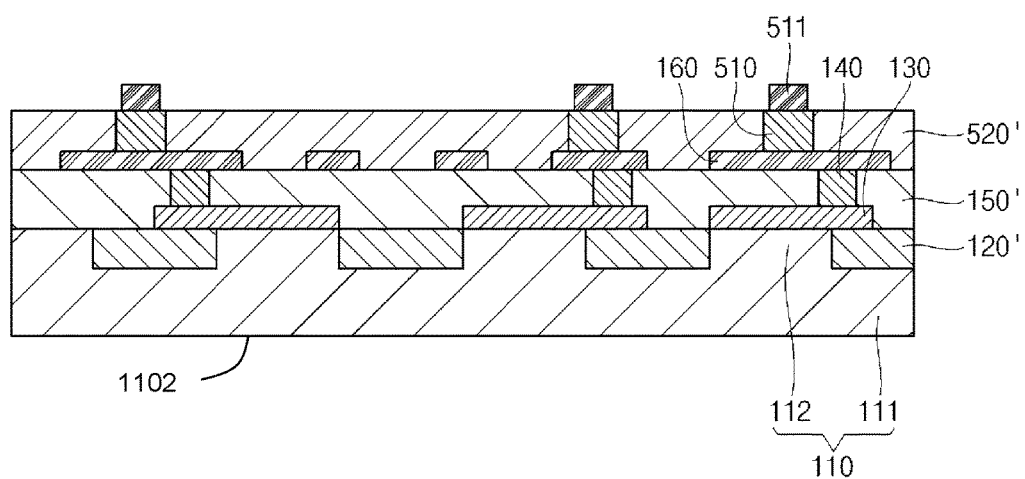

Then, as illustrated in FIG. 7C, in the step of third encapsulating (S28), part of the upper portion of the third encapsulant 520 is removed to expose the conductive posts 510 to the outside. In one embodiment, a grinding process is used to remove part of the upper portion of the third encapsulant 520 to provide third encapsulant 520'. In one embodiment, the surface of the third encapsulant 520' is substantially coplanar with top surfaces of the conductive posts 510. In one embodiment, as illustrated in FIG. 7D, in the step of third encapsulating (S28), bump pads 511 or conductive bumps 511 are disposed on top surfaces of the conductive posts 510 exposed to the outside.

Figure 7E:
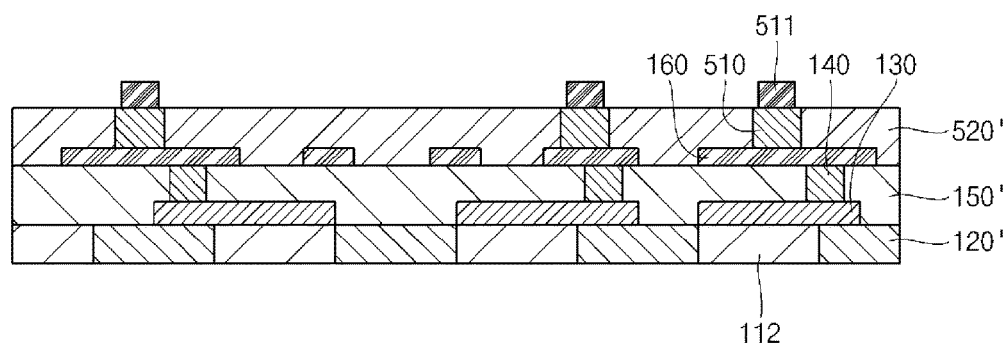

In the step of material removal or back grinding (S29), the bottom surface 1102 of the main frame 110 is removed to expose the first encapsulant 120' and the leads 112 to the outside as illustrated in FIG. 7E. In one embodiment, a grinding process is used for the material removal step. In one embodiment, the first encapsulant 120' and the bottom surfaces of the leads 112 are substantially coplanar after the step of material removal (S29).

Figure 7F:
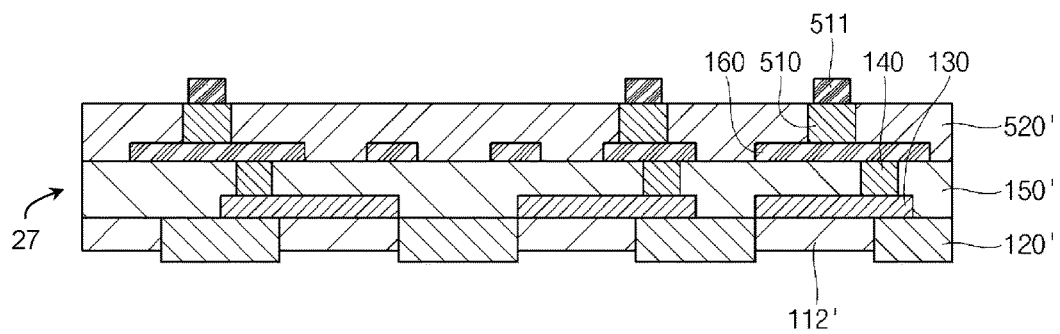

In the step of etching or recessing (S30), the exposed first encapsulant 120' or the exposed leads 112 are etched or recessed with respect to each other. In one embodiment, as illustrated in FIG. 7F, in the step of etching (S30), bottom surfaces of the leads 112 may be etched or thinned. In accordance with this embodiment, the first encapsulant 120' may downwardly protrude relative to the leads 112' whose bottom surfaces are etched or thinned, and conductive structures, such as solder structure or balls to be described later, may be attached to the leads 112', which have their lower surfaces etched or recessed in the step of etching (S30). In accordance with the present embodiment, an embodiment of a multi-layer encapsulated conductive substrate 27 is provided as illustrated in FIG. 7F. In one embodiment, the multi-layer conductive substrate 27, which may be prepared in advance of final assembly steps and may include the leads 112', the first encapsulant 120', the first pattern layer 130, the conductive vias 140, the second encapsulant 150', the second pattern layer 160, the conductive posts 510, the third encapsulant 520', and the bumps pads 511.

Figure 7G:
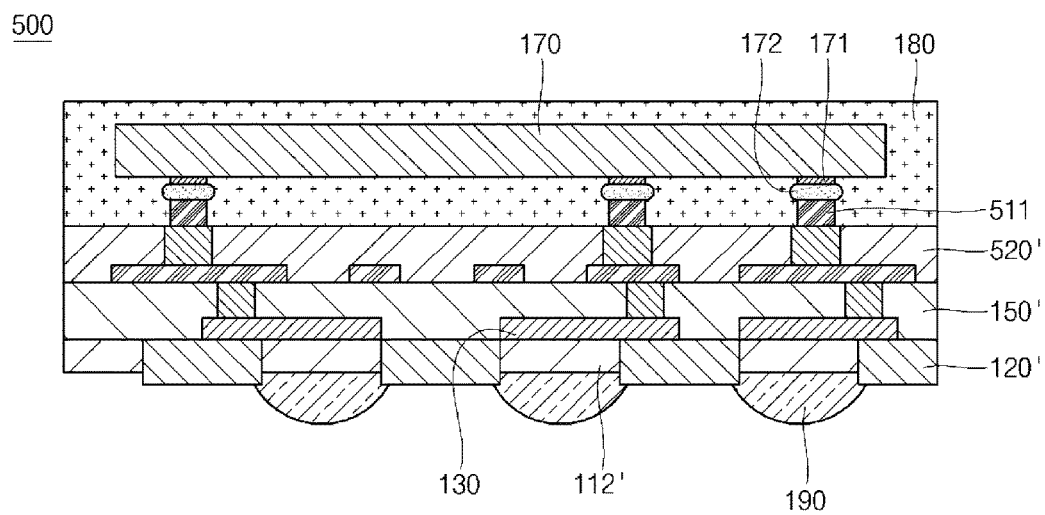

In the step of attaching the semiconductor die (S31), the semiconductor die 170 is electrically connected to the second pattern layer 160. In accordance with the present embodiment and as illustrated in FIG. 7G, in one embodiment the semiconductor die 170 may be attached to the conductive posts 510 using bump pads 511. In one embodiment, the semiconductor die 170 comprises a silicon material and a plurality of semiconductor devices are formed in the semiconductor die 170. In one embodiment, a plurality of conductive pads 171 are formed on a bottom surface of the semiconductor die 170 and conductive bumps 172 are formed on the conductive pads 171. In one embodiment, in the step of attaching the semiconductor die (S31), the conductive bumps 172 are connected to the bump pads 511 formed on the conductive posts 510. Therefore, the semiconductor die 170 is electrically connected to the conductive posts 510, the second pattern layer 160, the conductive vias 140, the first pattern layer 130 and the leads 112'. In addition, in the step of attaching the semiconductor die (S31), after the semiconductor die 170 is attached, the semiconductor die 170 can be encapsulated using the encapsulant 180 as described previously. In one embodiment, conductive structures, such as solder structures or balls 190, are attached to the leads 112' having recessed bottom surfaces. Accordingly, the semiconductor package 500 according to a further embodiment is formed by the above-described manufacturing method.

Figure 7H:
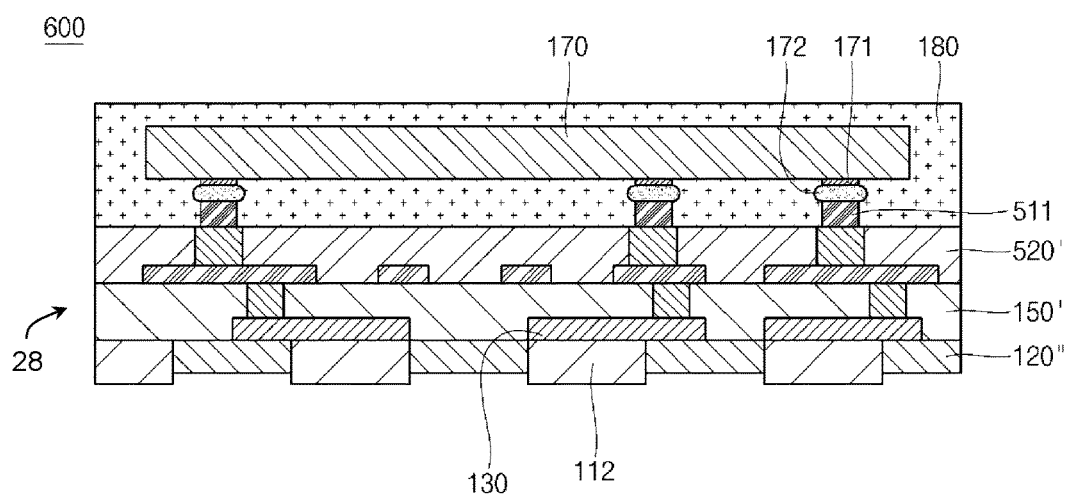

In an alternative embodiment, as illustrated in FIG. 7H, in the step of etching or recessing (S30), the first encapsulant 120' may be etched or thinned. Therefore, the leads 112 may downwardly protrude relative to the etched first encapsulant 120". In accordance with the present embodiment, the leads 112 may serve as pads configured to directly attach to an external circuit without separate conductive structures, such as solder balls. The semiconductor die 170 illustrated in FIG. 7H is electrically connected to the conductive posts 510 and is encapsulated using the encapsulant 180 as described previously, thereby forming a semiconductor package 600 according to still further embodiment. In accordance with the present embodiment, FIG. 7H illustrates an alternative embodiment of a multi-layer encapsulated conductive substrate 28, which may be prepared in advance of final assembly steps and may include the leads 112, the first encapsulant 120", the conductive vias 140, the second encapsulant 150', the second pattern layer 160, the conductive posts 510, the third encapsulant 520', and the bump pads 511.

From all of the foregoing, one of skill in the art can determine that in accordance with one embodiment, a semiconductor package includes a substrate including a main frame having a plurality of leads arranged thereon to be spaced apart from each other, a first encapsulant formed between the plurality of leads, a first pattern layer electrically connected to the plurality of leads and extending to a top portion of the first encapsulant, vias formed on the first pattern layer, a second encapsulant encapsulating the first pattern layer and the vias, and a second pattern layer electrically connected to the vias and extending to a top portion of the second encapsulant, a semiconductor die electrically connected to the second pattern layer, and an encapsulant encapsulating the semiconductor die on a top portion of the substrate.

From all of the foregoing, one of skill in the art can determine that in accordance with another embodiment, a manufacturing method of a semiconductor package includes preparing a main frame and half etching a top portion of the main frame to form a frame and a plurality of leads protruding from the frame, first encapsulating the leads by a first encapsulant and grinding a top portion of the first encapsulant to expose the leads to the outside, forming a first pattern layer electrically connected to the leads on the main frame, forming vias electrically connected to the first pattern layer on the first pattern layer, second encapsulating the vias and the first pattern layer using a second encapsulant and grinding a top portion of the second encapsulant to expose the vias to the outside, forming a second pattern layer electrically connected to the vias on the vias, back grinding a bottom surface of the main frame to remove the frame and exposing bottom surfaces of the leads and a bottom surface of the first encapsulant, etching the bottom surfaces of the leads or the bottom surface of the first encapsulant, and attaching a semiconductor die to the top portion of the main frame.

From all of the foregoing, one of skill in the art can determine that in accordance with a further embodiment, a manufacturing method of a semiconductor package includes preparing a main frame and half etching a top portion of the main frame to form a frame and a plurality of leads protruding from the frame, first encapsulating the leads by a first encapsulant and grinding a top portion of the first encapsulant to expose the leads to the outside, first back grinding a bottom surface of the main frame to remove the frame and exposing first surfaces of the leads and a first surface of the first encapsulant to the outside, turning over the main frame to allow the first surfaces of the leads exposed to the outside through the first back grinding to face upward and forming a first pattern layer electrically connected to the leads on the leads, forming vias electrically connected to the first pattern layer on the first pattern layer, second encapsulating the vias and the first pattern layer using a second encapsulant and grinding a top portion of the second encapsulant to expose the vias to the outside, forming a second pattern layer electrically connected to the vias on the vias, second back grinding a bottom surface of the first encapsulant to expose the leads to the outside, etching the bottom surfaces of the leads or the bottom surface of the first encapsulant, and attaching a semiconductor die to the top portion of the main frame.

In view of all the above, it is evident that a novel method of fabricating a semiconductor package using a multi-layer encapsulated conductive structure that may be prepared in advance as well as the structure have been disclosed. Including, among other features, a plurality of leads spaced apart from each other, a first encapsulant disposed between the plurality of leads, a first conductive layer electrically connected to the plurality of leads; conductive pillars disposed on the first conductive layer, a second encapsulant encapsulating the first conductive layer and the conductive pillars, and a second conductive layer electrically connected to the conductive pillars and exposed in the second encapsulant. The multi-layer encapsulated conductive substrate may be prepared in advance of final assembly with a semiconductor die to save on cycle time. The multi-layer encapsulated conductive substrate can be made in a fine pitch configuration, such as a micro lead frame configuration to support the demand for miniaturization and high performance electronic devices.

While the present invention has been particularly shown and described with reference to exemplary embodiments thereof, it will be understood by those of ordinary skill in the art that various changes in form and details may be made therein without departing from the spirit and scope of the present invention as defined by the following claims. By way of example, a major surface of the semiconductor die 170 opposite to the major surface electrically connected to the multi-layer encapsulated conductive substrate may be exposed to the outside of encapsulate 180. Also, additional encapsulated or molded conductive layers may be added to the configurations described herein.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A semiconductor package comprising:
    a multi-layer encapsulated conductive substrate comprising:
        an encapsulated conductive structure consisting of:
            a plurality of leads spaced apart from each other; and
            a first encapsulant disposed between the plurality of leads;
        a first conductive layer electrically connected to the plurality of leads;
        conductive pillars disposed on the first conductive layer;
        a second encapsulant encapsulating the first conductive layer and the conductive pillars; and
        a second conductive layer electrically connected to the conductive pillars and disposed adjacent the second encapsulant;
    a semiconductor die electrically coupled to the second conductive layer; and
    a third encapsulant encapsulating at least the semiconductor die, wherein:
        each of the plurality of leads comprises a top surface adjacent the first conductive layer and a bottom surface exposed outside of the first encapsulant;
        the first conductive layer laterally overlaps onto a portion of the first encapsulant and physically contacts the first encapsulant; and
        the top surfaces and the bottom surfaces of the plurality of leads are devoid of the first encapsulant.

2. The semiconductor package of claim 1, wherein:
    a bottom surface of the first encapsulant protrudes to a bottom portion of the multi-layer encapsulated conductive substrate more than the bottom surfaces of the plurality of leads; and
    the third encapsulant physically contacts the second encapsulant.

3. The semiconductor package of claim 2 further comprising:
    solder structures attached to the bottom surfaces of the plurality of leads.

4. The semiconductor package of claim 1, wherein bottom surfaces of the plurality of leads protrude to a bottom portion of the multi-layer encapsulated conductive substrate more than a bottom surface of the first encapsulant.

5. The semiconductor package of claim 1 further comprising:
    conductive posts disposed on the second conductive layer; and
    a fourth encapsulant encapsulating the second conductive layer and the conductive posts, wherein:
        the conductive posts are exposed in the fourth encapsulant;
        the semiconductor die is electrically coupled to the conductive posts; and the third encapsulant physically contacts the fourth encapsulant.

6. The semiconductor package of claim 5, wherein:
conductive bumps are formed under the semiconductor die; and
the conductive bumps are electrically connected to the conductive posts.

7. The semiconductor package of claim 1, wherein:
at least one conductive pillar is disposed on the first conductive layer where the first conductive layer overlaps the first encapsulant;
the at least one conductive pillar is laterally offset from a respective one of the plurality of leads electrically coupled to the at least one conductive pillar;
the first encapsulant comprises a first mold compound; and
the second encapsulant comprises a second mold compound.

8. The semiconductor package of claim 5, wherein the semiconductor die comprises:
a first major surface;
a second major surface opposed to the first major surface; and
a pair of sidewall surfaces extending from the first major surface to the second major surface in a cross-sectional view, wherein:
all of the conductive posts are disposed laterally inward from the pair of sidewall surfaces in the cross-sectional view.

9. The semiconductor package of claim 1, wherein:
the first conductive layer comprises a first patterned layer that contacts the first encapsulant; and
the second conductive layer comprises a second patterned layer that contacts the second encapsulant.

10. A semiconductor package comprising:
a multi-layer encapsulated conductive substrate comprising:
an encapsulated conductive structure consisting of:
a plurality of leads spaced apart from each other; and
a first encapsulant formed between the plurality of leads, wherein each of the plurality of leads comprises a top surface and a bottom surface exposed outside of the first encapsulant, and wherein the top surface and the bottom surface of each of the plurality of leads are devoid of the first encapsulant;
a first conductive layer electrically connected to the plurality of leads, laterally extending to overlap a top surface portion of the first encapsulant and physically contacting the first encapsulant;
conductive pillars formed on the first conductive layer;
a second encapsulant encapsulating the first conductive layer and the conductive pillars, wherein top surfaces of the conductive pillars are exposed in the second encapsulant; and
a second conductive layer electrically connected to the conductive pillars, laterally extending to overlap a top surface portion of the second encapsulant, and physically contacting the second encapsulant;
a semiconductor die electrically coupled to the second conductive layer; and
a third encapsulant encapsulating at least the semiconductor die, wherein:
the third encapsulant physically contacts the second encapsulant.

11. The semiconductor package of claim 10, wherein:
a bottom surface of the first encapsulant protrudes to a bottom portion of the multi-layer encapsulated conductive substrate more than the bottom surfaces of the plurality of leads.

12. The semiconductor package of claim 10, further comprising:
conductive posts formed on the second conductive layer; and
a fourth encapsulant encapsulating the second conductive layer and the conductive posts.

13. The semiconductor package of claim 12, wherein a plurality of bump pads are formed under the semiconductor die and the plurality of bump pads are electrically connected to the conductive posts.

14. The semiconductor package of claim 12, wherein the semiconductor die comprises:
a first major surface;
a second major surface opposed to the first major surface; and
a pair of sidewall surfaces extending from the first major surface to the second major surface in a cross-sectional view, wherein:
each of the conductive posts is disposed laterally inward from the pair of sidewall surfaces in the cross-sectional view.

15. A semiconductor package comprising:
a multi-layer encapsulated conductive substrate comprising:
an encapsulated conductive structure consisting of:
conductive leads spaced apart from each other; and
a first encapsulant disposed between the conductive leads;
a first conductive layer electrically connected to the conductive leads laterally extending to overlap a top surface portion of the first encapsulant and physically contacting the first encapsulant;
conductive pillars disposed on the first conductive layer;
a second encapsulant encapsulating the first conductive layer and the conductive pillars, wherein top surfaces of the conductive pillars are exposed to the outside of the second encapsulant; and
a second conductive layer electrically connected to the conductive pillars and laterally extending to overlap a top surface portion of the second encapsulant and physically contacting the second encapsulant;
a semiconductor die electrically coupled to the second conductive layer; and
a third encapsulant covering at the least the semiconductor die, wherein:
bottom surfaces of the conductive leads are exposed in a bottom surface of the first encapsulant; and
top surfaces of the conductive leads and the bottom surfaces of the conductive leads are devoid of the first encapsulant.

16. The semiconductor package of claim 15, wherein:
the third encapsulant physically contacts the second encapsulant;
the first conductive layer comprises a first patterned layer; and
the second conductive layer comprises a second patterned layer.

17. The semiconductor package of claim 16, wherein:
at least one conductive pillar is positioned directly overlying a top surface the first encapsulant; and the bottom surfaces of the conductive leads are recessed to allow the first encapsulant to downwardly protrude relative to the conductive leads.

18. The semiconductor package of claim 17 further comprising solder structures attached to the bottom surfaces of the conductive leads.

19. The semiconductor package of claim 16 further comprising:
conductive posts disposed on first portions of the second patterned layer; and
a fourth encapsulant encapsulating the conductive posts, wherein:
   second portions of the second patterned layer are provided absent a conductive post;
   the conductive posts are exposed to the outside of the fourth encapsulant; and
   the semiconductor die is electrically coupled to the conductive posts.

20. The semiconductor package of claim 19, wherein:
the semiconductor die comprises:
   a first major surface;
   a second major surface opposed to the first major surface; and
   a pair of sidewall surfaces extending from the first major surface to the second major surface in a cross-sectional view;
each of the conductive posts is disposed laterally inward from the pair of sidewall surfaces in the cross-sectional view; and
the semiconductor die is attached to the conductive posts with conductive bumps.

* * * * *